United States Patent
Kuo et al.

(10) Patent No.: US 12,315,784 B2
(45) Date of Patent: May 27, 2025

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Hung-Yi Kuo, Taipei (TW); Cheng-Chieh Hsieh, Tainan (TW); Kuo-Chung Yee, Taoyuan (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 424 days.

(21) Appl. No.: 17/746,955

(22) Filed: May 17, 2022

(65) Prior Publication Data

US 2023/0378026 A1  Nov. 23, 2023

(51) Int. Cl.
*H01L 23/48* (2006.01)
*H01L 23/00* (2006.01)
*H01L 23/522* (2006.01)
*H01L 23/528* (2006.01)

(52) U.S. Cl.
CPC ........ *H01L 23/481* (2013.01); *H01L 23/5226* (2013.01); *H01L 23/5286* (2013.01); *H01L 24/02* (2013.01); *H01L 24/13* (2013.01); *H01L 2224/02331* (2013.01); *H01L 2224/131* (2013.01); *H01L 2924/014* (2013.01)

(58) Field of Classification Search
CPC .............. H01L 23/481; H01L 23/5226; H01L 23/5286
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2* | 3/2016 | Yu | H01L 24/97 |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2* | 9/2016 | Lin | H01L 21/563 |
| 9,461,018 B1* | 10/2016 | Tsai | H01L 21/6835 |
| 9,496,189 B2* | 11/2016 | Yu | H01L 22/20 |

(Continued)

FOREIGN PATENT DOCUMENTS

| | | | | |
|---|---|---|---|---|
| EP | 4187600 A1 * | 5/2023 | ........... | H01L 23/481 |
| TW | 202347687 A * | 12/2023 | ........... | H01L 21/743 |

OTHER PUBLICATIONS

"Office Action of Taiwan Counterpart Application", issued on Sep. 28, 2023, pp. 1-8.

Primary Examiner — Laura M Menz
(74) Attorney, Agent, or Firm — JCIPRNET

(57) ABSTRACT

A semiconductor package and a manufacturing method thereof is provided. The semiconductor package includes a first semiconductor die, including a substrate and transistors formed at a front side of the substrate; a power distribution network, spreading at a back side of the substrate and penetrating through the substrate, to provide power and ground signals to the transistors; a dielectric material, laterally surrounding the first semiconductor die; and a second semiconductor die, having a central portion bonded with the first semiconductor die and a peripheral portion in contact with the dielectric material.

18 Claims, 33 Drawing Sheets

(56) References Cited

U.S. PATENT DOCUMENTS

| | | | |
|---|---|---|---|
| 9,666,502 B2* | 5/2017 | Chen | H01L 21/76831 |
| 9,735,131 B2* | 8/2017 | Su | H01L 25/50 |
| 10,879,138 B1* | 12/2020 | Chen | H01L 25/50 |
| 11,335,610 B2* | 5/2022 | Chen | H01L 25/0657 |
| 11,362,066 B2* | 6/2022 | Chen | H01L 24/20 |
| 11,749,643 B2* | 9/2023 | Yang | H01L 23/49811 |
| | | | 257/737 |
| 11,749,729 B2* | 9/2023 | Chen | H10D 84/0149 |
| | | | 257/288 |
| 2014/0001645 A1* | 1/2014 | Lin | H01L 25/0657 |
| | | | 257/E23.079 |
| 2014/0225258 A1* | 8/2014 | Chiu | H01L 21/6835 |
| | | | 257/737 |
| 2014/0252572 A1* | 9/2014 | Hou | H01L 25/0655 |
| | | | 438/112 |
| 2016/0307872 A1* | 10/2016 | Chen | H01L 21/4857 |
| 2018/0145030 A1 | 5/2018 | Beyne et al. | |
| 2020/0395254 A1* | 12/2020 | Chen | H01L 25/0657 |
| 2021/0151355 A1* | 5/2021 | Chen | H01L 24/08 |
| 2021/0305209 A1* | 9/2021 | Chen | H01L 23/3171 |
| 2021/0375762 A1* | 12/2021 | Chen | G06F 30/3953 |
| 2022/0238397 A1* | 7/2022 | Chen | H01L 25/50 |
| 2022/0271014 A1* | 8/2022 | Chen | H01L 24/20 |
| 2022/0285318 A1* | 9/2022 | Yang | H01L 23/544 |
| 2022/0320299 A1* | 10/2022 | Chen | H01L 29/401 |
| 2022/0367430 A1* | 11/2022 | Lee | H01L 23/50 |
| 2023/0038892 A1* | 2/2023 | Chen | H01L 23/5385 |
| 2023/0077803 A1* | 3/2023 | Choi | H01L 25/0657 |
| | | | 257/774 |
| 2023/0170297 A1* | 6/2023 | Chen | H01L 23/481 |
| | | | 257/774 |
| 2023/0187307 A1* | 6/2023 | Yu | H01L 23/3735 |
| | | | 257/213 |
| 2023/0253351 A1* | 8/2023 | Wang | H01L 25/50 |
| | | | 257/773 |
| 2023/0274988 A1* | 8/2023 | Chen | H01L 24/03 |
| | | | 257/773 |
| 2023/0314702 A1* | 10/2023 | Yu | H01L 25/0655 |
| | | | 385/14 |
| 2023/0326766 A1* | 10/2023 | Liu | H01L 24/33 |
| | | | 257/774 |
| 2023/0361079 A1* | 11/2023 | Yang | H01L 21/56 |
| 2023/0378026 A1* | 11/2023 | Kuo | H01L 23/5286 |
| 2023/0386961 A1* | 11/2023 | Wang | H01L 25/0655 |
| 2024/0063160 A1* | 2/2024 | Lu | H01L 24/80 |
| 2024/0071941 A1* | 2/2024 | Chen | H10D 62/121 |
| 2024/0074315 A1* | 2/2024 | Madia | H10N 10/01 |
| 2024/0128174 A1* | 4/2024 | Yim | H01L 23/5389 |

\* cited by examiner

SEMICONDUCTOR PACKAGE AND MANUFACTURING METHOD THEREOF

BACKGROUND

Fabricating more compact and more densely packed devices with greater computing ability is a continuing objective in building integrated circuits. An integrated circuit includes power and ground connections. Typically, power and ground signals are provided to the devices in the cells through power rails embedded in a stack of metallization layers over the devices. In this way, the power and ground signals have to be provided to the cells via a long path extending through the stack of metallization layers. In addition, as the power rails are designed in already crowded routing areas of the cells, the power rails may prevent further scaling of the cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
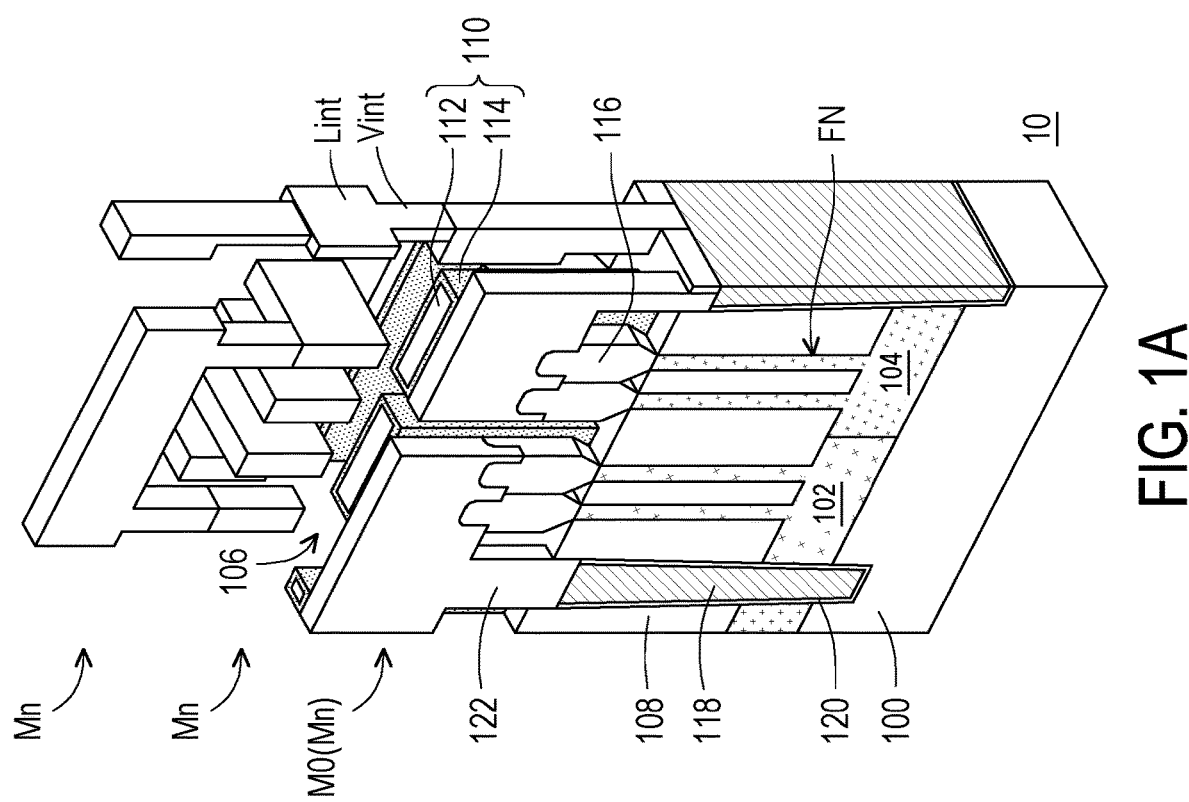
FIG. 1A is a schematic three-dimensional view illustrating a portion of an integrated circuit, according to some embodiment of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments of the present disclosure, an integrated circuit with buried power rails is provided. Devices in the integrated circuit are formed at a front side of a substrate, and the buried power rails are configured to provide power and ground signals to the devices from a back side of the substrate. Further, a semiconductor package including a semiconductor die formed with the integrated circuit is also provided.

FIG. 1A is a schematic three-dimensional view illustrating a portion of an integrated circuit 10, according to some embodiment of the present disclosure.

Referring to FIG. 1A, the integrated circuit 10 is built on a front side of a substrate 100. The substrate 100 may be a semiconductor wafer, such as a silicon wafer. Wells 102, 104 may be formed in the substrate 100, and extend into the substrate 100 from a front surface of the substrate 100. The wells 102, 104 are doped regions, and have opposite conductive types. For instance, the wells 102 are formed with N-type, while the wells 104 are formed with P-type.

Transistors 106 are formed on the front side of the substrate 100. In some embodiments, the transistors 106 are fin-type field effect transistors (finFETs). In these embodiments, upper portions of the wells 102, 104 may be shaped into fin structures FN. An isolation structure 108 may be provided in between the fin structures FN, such that base parts of the fin structures FN are buried in the isolation structure 108, while top parts of the fin structures FN are protruded with respect to the isolation structure 108. Gate structures 110 of the transistors 106 extend on the isolation structure 108, and the top parts of the fin structures FN protruding from the isolation structure 108 are intersected with and covered by the gate structures 110. In some embodiments, the gate structures 110 respectively include a gate electrode 112 and a sidewall spacer 114 laterally surrounding the gate electrode 112. Although not shown, each gate structure 110 further includes a gate dielectric layer extending between the gate electrode 112 and the underlying fin structure FN.

Further, the transistors 106 may also include pairs of source/drain structures 116. Each pair of source/drain structures 116 are located at opposite sides of one of the gate structures 110. According to some embodiments, portions of the fin structures FN at opposite sides of the gate structures 110 are recessed from top surfaces, and the source/drain structures 116 may be disposed on these recessed regions of the fin structures FN. Conduction channels of the transistors 106 can be established in portions of the fin structures FN wrapped by the gate structures 108, and controlled by the gate structures 108. Once a conduction channel of a transistor 106 is formed, the source/drain structures 116 of this transistor 106 are electrically connected with each other through the conduction channel. In other words, electrical potentials at the source/drain structures 116 can be controlled by switching the transistors 106. Further, the transistors 106 built on the wells 102 and the transistors 106 built on the wells 104 may have opposite conductive types, and may have different threshold voltages. By interconnecting the transistors 106 of opposite conductive types with various configurations, various logic functions can be performed by these interconnected transistors 106. In those embodiments where the wells 102 are N-type wells and the wells 104 are P-type wells, the transistors 106 built on the fin structures FN shaped from the wells 102 may be N-type transistors, while the transistors 106 built on the fin structures FN shaped from the wells 104 may be P-type transistors.

In alternative embodiments, the transistors 106 are planar type field effect transistors, gate-all-around (GAA) field effect transistors or other types of transistors. Those skilled in the art may modify structures of the transistors 106 according to a selected architecture of the transistors 106. The present disclosure is not limited to the architecture of the transistors 106.

In order to interconnect and power the transistors 106, multiple metallization layers Mn are formed on the transistors 106. The metallization layers Mn may include a metallization layer M0 having conductive features laterally extending on the source/drain structures 116 of the transistors 106. Some of the conductive features in the metallization layer M0 are electrically connected to the source/drain structures 116, and may be separated from the gate electrodes 112 of the gate structures 110 by the sidewall spacers 114. In some embodiments, the metallization layer M0 is formed to a height substantially leveled with top surfaces of the gate structure 110.

Conductive features in metallization layers Mn stacked over the metallization layer M0 out rout the conductive features in the metallization layer M0 and the gate electrodes 112 of the gate structures 110. The bottommost one of the metallization layers Mn over the metallization layer M0 may include contact vias Vint (only partially shown) standing on the conductive features of the metallization layer M0 and the gate electrodes 112 of the gate structures 110, and may include conductive lines Lint laterally extending over the contact vias Vint and electrically connected to the contact vias Vint. Similarly, the metallization layer Mn further above the metallization layer M0 also include contact vias and overlying conductive lines. Although only three metallization layers Mn are depicted in FIG. 1A, more of the metallization layers may be actually formed on the transistors 106.

Power distribution network (PDN) of the integrated circuit 10 is configured to transmit power and ground signals, and may include power rails 118. The power rails 118 may be formed as conductive walls, and may laterally extend in the isolation structure 108 and the substrate 100, rather than lying above the isolation structure 108 and the substrate 100. Therefore, the power rails 118 may also be referred to as buried power rails. In some embodiments, the power rails 118 respectively include a core conductor and an adhesion layer (not shown) wrapping around and lying under the core conductor. In addition, in some embodiments, the power rails 118 are respectively separated from the substrate 100 and the isolation structure 108 by at least one insulating layer 120. In these embodiments, each power rail 118 is laterally surrounded and underlain by the insulating layer 120. The insulating layers 120 may cut off possible leakage paths across the interfaces between the power rails 118 and the substrate 100. Further, in some embodiments, top surfaces of the power rails 118 are recessed with respect to a top surface of the isolation structure 108. On the other hand, in some embodiments, bottom surfaces of the power rails 118 are lower than bottom ends of the wells 102, 104. However, in alternative embodiments, the bottom surfaces of the power rails 118 are leveled with or higher than the bottom ends of the wells 102, 104.

The PDN may further include contact plugs 122 connecting the power rails 118 to the conductive features in the overlying metallization layers Mn. The power and ground signals can be provided to the transistors 106 through the power rails 118 and conductive features in the metallization layers Mn. The contact plugs 122 may stand on the isolation structure 108. In those embodiments where the top surfaces of the power rails 118 are lower than the top surface of the isolation structure 108, bottom ends of the contact plugs 120 may be lower than the top surface of the isolation structure 108 as well.

The power and ground signals can be provided to the transistors 106 through various paths. Along a first path, the power and ground signals are provided to the conductive features in the metallization layer M0 through the power rails 118 and the contact plugs 122, then to the source/drain structures 116 of the transistors 106 from the conductive features in the metallization layer M0. Along a second path, the power and ground signals are provided to the conductive features in metallization layer Mn right above the metallization layer M0 through the power rails 118, the contact plugs 122 and the conductive features in the metallization layer M0, and to the source/drain structures 116 of the transistors 106 through the conductive features in the metallization layer M0. Further, along a third path, the power and ground signals are provided to the conductive features in the metallization layer Mn further above the metallization layer M0, then to the source/drain structures 116 of the transistors 106 through conductive features in between.

Figure 2A:
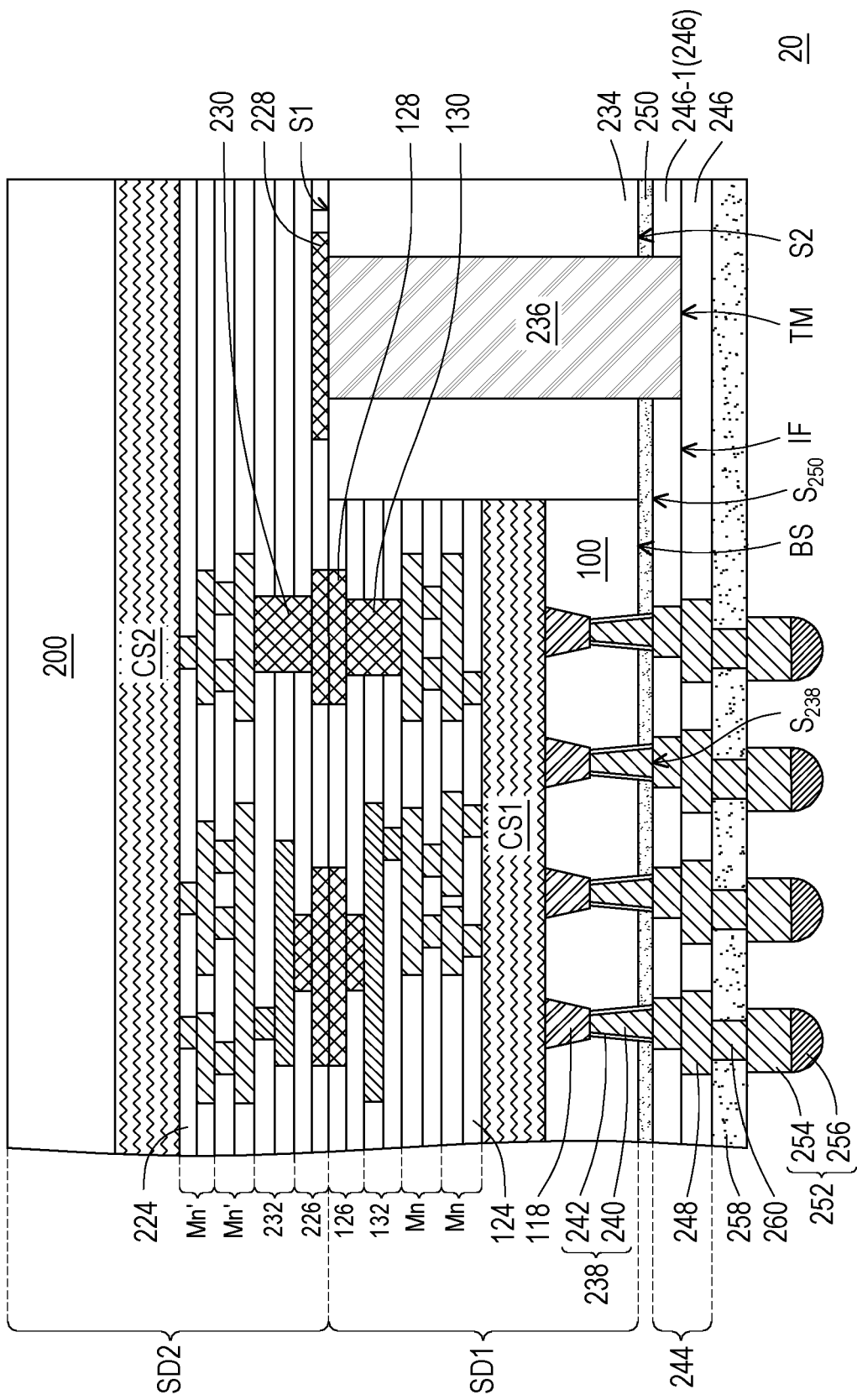
FIG. 2A is a schematic cross-sectional view illustrating a semiconductor package, according to some embodiments of the present disclosure.

As will be further described with FIG. 2A, the power and ground signals fed to the transistors 106 are provided to the power rails 118 from a back side of the substrate 100, which is facing away from the front side of the substrate 100 built with the transistors 106. As compared to providing power and ground signals to the transistors 106 from above the stack of metallization layers Mn, the power and ground signals can be provided to the transistors 106 along a shorter path from the back side of the substrate 100, according to embodiments of the present disclosure. Moreover, since the power rails 118 are disposed below the transistors 106, routing areas above the transistors 106 can be significantly released.

Figure 1B:
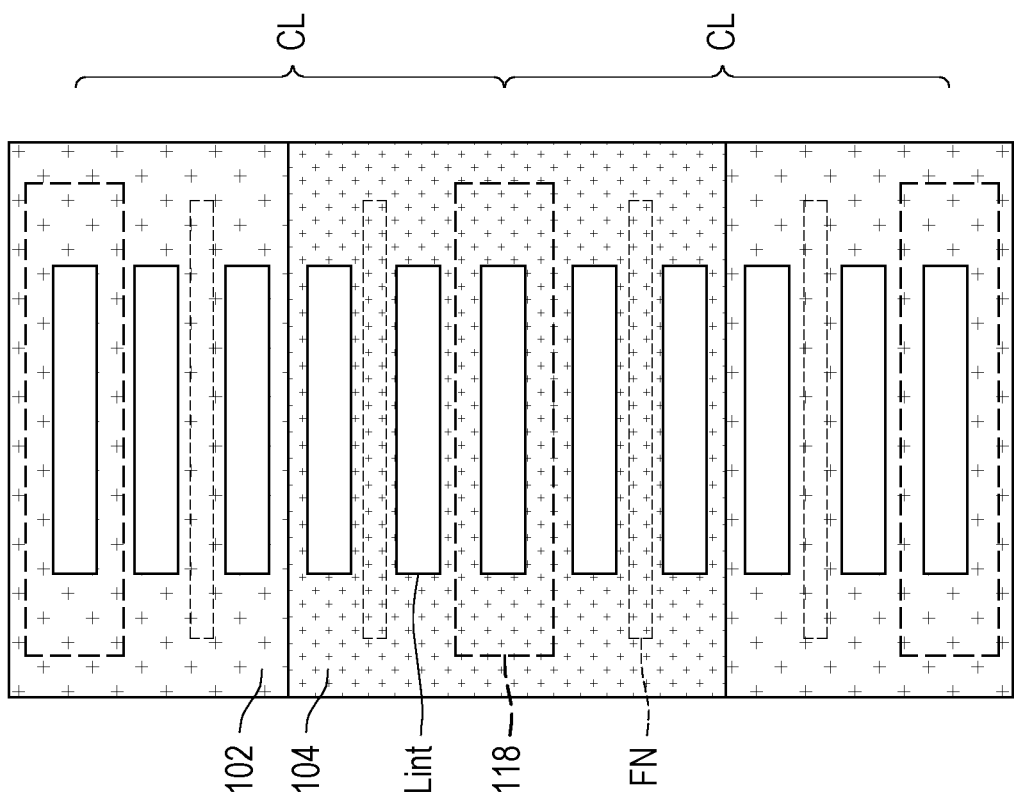
FIG. 1B is a schematic plan view illustrating adjacent cells in the integrated circuit described with reference to FIG. 1A.

FIG. 1B is a schematic plan view illustrating adjacent cells CL in the integrated circuit 10 described with reference to FIG. 1A.

Referring to FIG. 1A and FIG. 1B, according to some embodiments, the wells 102, 104 are alternately arranged, and each cell CL (e.g., logic cell or memory cell) in the integrated circuit 10 may span across an interface between adjacent wells 102, 104. In these embodiments, each cell CL may include fin structures FN in adjacent wells 102, 104, such as (but not limited to) a fin structure FN in a well 102 and a fin structure FN in a well 104. Further, a boundary of a cell CL may be defined by a routing area for routing the transistors 106 built on the fin structures FN of the cell CL. Some conductive features in the metallization layers Mn and some power rails 118 are enclosed in the routing area of each cell CL. For conciseness, only the conductive features in one of the metallization layers Mn right above the metallization layer M0 are shown in FIG. 1B. For instance, as shown in FIG. 1B, each cell CL may include 5 conductive lines Lint in this metallization layer Mn, and also include 2 power rails 118. The fin structures FN, the conductive lines Lint and the power rails 118 may extend along the same direction. Each fin structure FN may extend between adjacent conductive lines Lint. Further, the power rails 118 may be overlapped with some of these conductive lines Lint. According to some embodiments, the power rails 118 of each cell CL extend along two edges of each cell CL, and each power rail 118 may be shared by adjacent cells CL. In addition, in some embodiments, the power rails 118 are thicker than the conductive lines Lint and the fin structures FN.

Since the power rails 118 are disposed below the metallization layers Mn rather than being embedded in the metallization layers Mn, the routing area of each cell CL (i.e., the size of each cell CL) can be reduced by laying the power rails 118 of each cell CL to be overlapped with the conductive features in the same cell CL. Accordingly, cell density of the integrated circuit 10 can be increased. Alternatively, routing area of each cell CL can be released.

The integrated circuit 10 as described with reference to FIG. 1A and FIG. 1B can be processed to form a semiconductor die, and such semiconductor die can be bonded with another semiconductor die during a packaging process. Further, the PDN of the integrated circuit 10 can be completely formed during the packaging process, and the power rails 118 can be routed to the back side of the substrate 100.

FIG. 2A is a schematic cross-sectional view illustrating a semiconductor package 20, according to some embodiments of the present disclosure.

Referring to FIG. 2A, the semiconductor package 20 includes a first semiconductor die SD1 having the integrated circuit 10 as described with reference to FIG. 1A and FIG. 1B. For conciseness, a portion of the integrated circuit 10 spanning from bottom ends of the well 102, 104 to a top end of a lower sub-stack of the metallization layers Mn is depicted as a circuit structure CS1 in FIG. 2A. An upper sub-stack of the metallization layers Mn located on the circuit structure CS1 is still revealed in FIG. 2A. As similar to the metallization layers Mn in the upper sub-stack of the metallization layers Mn, the conductive features in all of the metallization layers Mn are embedded in a stack of dielectric layers 124.

Further, the first semiconductor die SD1 may include bonding metals 126 formed in the topmost dielectric layers 124. The bonding metals 126 are electrically connected to the conductive features in the metallization layers Mn, and can be bonded to bonding metals of another semiconductor die (e.g., the second semiconductor die SD2 as will be described). In some embodiments, the bonding metals 126 include bonding pads 128 formed in the topmost dielectric layer 124, and includes conductive pillars 130 respectively in contact with one of the bonding pads 128 from below. According to some embodiments, some of the conductive pillars 130 are connected to the topmost conductive features in the metallization layers Mn through redistribution elements 132. As similar to the conductive features in the metallization layers Mn, the redistribution elements 132 may include contact vias for establishing vertical conduction paths and conductive lines for establishing lateral conduction paths. On the other hand, other conductive pillars 130 may reach the underlying conductive features of the topmost metallization layer Mn. As a result, the conductive pillars 130 may have different heights. The conductive pillars 130 in direct contact with the conductive features in the topmost metallization layer Mn may be taller than the conductive pillars 130 connected to the conductive features in the topmost metallization layer Mn through the redistribution elements 132.

The semiconductor package 20 may further include a second semiconductor die SD2 bonded to the first semiconductor die SD1. As similar to the first semiconductor die SD1, the second semiconductor die SD2 may include a substrate 200 and a circuit structure CS2 built at a front side of the substrate 200. The circuit structure CS2 is a base portion of an integrated circuit as similar to the integrated circuit 10 described with reference to FIG. 1A, and may include transistors and a sub-stack of metallization layers Mn'. Other metallization layers Mn' are still revealed in FIG. 2A, and the conductive features in all of the metallization layers Mn' may be embedded in a stack of dielectric layers 224. Further, the second semiconductor die SD2 may also include bonding metals 226. As similar to the bonding metals 126 in the first semiconductor die SD1, the bonding metals 226 may also include bonding pads 228 and conductive pillars 230. The bonding pads 228 are formed in the dielectric layer 224 most distant from the substrate 200, and at least some of the bonding pads 228 are connected to the conductive features in the metallization layers Mn' through the conductive pillars 230. In some embodiments, some of the conductive pillars 230 are connected to the conductive features in the metallization layers Mn' via redistribution elements 232, while other conductive pillars 230 reach the conductive features in the metallization layers Mn'. The redistribution elements 232 and the conductive features in the metallization layers Mn' include contact vias for establishing vertical conduction paths and conductive lines for establishing lateral conduction paths.

As a difference from the first semiconductor die SD1, in some embodiments, the second semiconductor die SD2 may not include power rails buried in the substrate 200. In these embodiments, power rails of the semiconductor die SD2 may be provided by conductive features in some of the metallization layers Mn', and transistors in the circuit structure CS2 may be fed with power and ground signals from the front side of the substrate 200.

The first and second semiconductor dies SD1, SD2 are bonded with each other, and may be operationally communicated with each other. According to some embodiments, the first and second semiconductor dies SD1, SD2 are bonded with each other by a hybrid bonding manner. In these embodiments, at least some bonding pads 128 of the first semiconductor die SD1 are bonded with the bonding pads 228 of the second semiconductor die SD2, and the dielectric layer 124 of the first semiconductor die SD1 surrounding the bonding pads 128 is bonded with the dielectric layer 224 of the second semiconductor die SD2 surrounding the bonding pads 228.

In some embodiments, the first semiconductor die SD1 is smaller in size, as compared to the second semiconductor die SD2. In these embodiments, the first semiconductor die SD1 may be laterally surrounded by a dielectric material 234. In addition to be in lateral contact with the first semiconductor die SD1, the dielectric material 234 is in contact with a peripheral portion of the second semiconductor die SD2 (e.g., from below the second semiconductor die SD2). In some embodiments, a thickness of the dielectric material 234 defined along a vertical direction may be substantially identical with a total thickness of the first semiconductor die SD1 defined from a back surface BS of the substrate 100 to a surface of the dielectric layer 124 bonded with the second semiconductor die SD2. In these embodiments, a first surface S1 of the dielectric material 234 (e.g., a top surface of the dielectric material 234) is in contact with the dielectric layer 224 of the second semiconductor die SD2 bonded with the first semiconductor die SD1 and some bonding pads 228 in the peripheral region of the second semiconductor die SD2, and is substantially coplanar with the surface of the dielectric layer 124 bonded with the second semiconductor die SD2. On the other hand, a second surface S2 of the dielectric material 234 opposite to the first surface S1 may be substantially coplanar with the back surface BS of the substrate 100. Furthermore, an outer sidewall of the dielectric material 234 (facing away from the first semiconductor die SD1) may be substantially coplanar with a sidewall of the second semiconductor die SD2. According to some embodiments, the dielectric material 234 is formed of a silicon-based dielectric material. The inorganic dielectric material may include silicon oxide, such as undoped silicon glass (USG) or spin-on-glass (SOG).

In some embodiments, through dielectric vias 236 penetrate through the dielectric material 234 to establish contact with the bonding pads 228 in the peripheral portion of the second semiconductor die SD2. For conciseness, only one of the through dielectric vias 236 is shown in FIG. 2A. The first semiconductor die SD1 may actually be laterally surrounded by the through dielectric vias 236. In some embodiments, the through dielectric vias 236 protrude with respect to the back surface of the substrate 100, and a vertical dimension of the through dielectric vias may be greater than a total thickness of the first semiconductor die SD1. Further, in some embodiments, at least some of the bonding pads 228 in contact with the through dielectric vias 236 may be dummy bonding pads, which may not connected to the conductive features in the metallization layers Mn'. In these embodiments, the through dielectric vias 236 in contact with the dummy bonding pads may be referred to as dummy through dielectric vias 234. By disposing the dummy bonding pads and the dummy through dielectric vias, metal content in the semiconductor package 20 can be increased, and possible warpage of the semiconductor package 20 can be reduced.

In order to rout the power rails 118 in the first semiconductor die SD1 to the back side of the substrate 100, through substrate vias (TSVs) 238 extending to the power rails 118 from the back side of the substrate 100 are disposed. According to some embodiments, the TSVs 238 protrude with respect to the back surface BS of the substrate. In addition, in some embodiments, the through dielectric vias 236 further protrude with respect to surfaces $S_{238}$ of the TSVs 238 facing away from the power rails 118. Each TSV 238 may include a through via 240 and a barrier layer 242 wrapping around the through via 240 and separating the through via 240 from the substrate 100. In certain cases, the barrier layers 242 may further extend in between the through vias 240 and the power rails 118. Moreover, although not depicted, the TSVs 238 may be deployed with a staggered arrangement, in which each row/column of the TSVs 238 is offset from adjacent rows/columns of the TSVs 238. The staggered arrangement may be designed for keeping sufficient spacing between adjacent TSVs 238. In some embodiments, the through via 240 is and the barrier layer 242 are respectively formed of W or Ru.

The TSVs 238 are further routed at the back side of the substrate 100 by a redistribution structure 244. According to some embodiments, the redistribution structure 244 includes a stack of dielectric layers 246 and redistribution elements 248 spreading in the stack of dielectric layers 246. The redistribution elements 248, as a part of the PDN, are electrically connected to the TSVs 238, and may include contact vias and conductive lines. The contact vias provide vertical routing paths, whereas the conductive lines provide lateral routing paths. Further, in some embodiments, the through dielectric vias 236 are designed as dummy through dielectric vias, and may extend into the stack of dielectric layers 246. In these embodiments, the through dielectric vias 236 may not connect with the redistribution elements 248. Further, the through dielectric vias 236 as the dummy through dielectric vias may extend through the dielectric layer 246 closest to the substrate 100 and the dielectric material 234 (also referred to as a dielectric layer 246-1), and may be terminated at an interface IF between the dielectric layer 246-1 and an adjacent dielectric layer 246. In other words, terminal surfaces TM of the dummy through dielectric vias 236 may be substantially coplanar with such interface IF. Moreover, the dummy through dielectric vias 236 may protrude with respect to the surfaces $S_{238}$ of the TSVs 238. The dielectric layers 246 may be formed of an inorganic dielectric material, such as silicon oxide. Although the redistribution structure 244 is depicted as having two dielectric layers 246 and the redistribution elements 248 spreading therein, the redistribution structure 244 may have more dielectric layers 246 and redistribution elements 248. The present disclosure is not limited to a staking height of the redistribution structure 244.

In some embodiments, a passivation layer 250 is inserted between the redistribution structure 244 and the substrate 100, and may further extend between the redistribution structure 244 and the dielectric material 234. In these embodiments, the back surface BS of the substrate 100 and a surface of the dielectric material 234 facing away from the second semiconductor die SD2 are covered and protected by the passivation layer 250. Further, the TSVs 238 and the through dielectric vias 236 may penetrate through the passivation layer 250. According to some embodiments, the surfaces of the TSVs 238 are substantially coplanar with a surface $S_{250}$ of the passivation layer 250 facing toward the redistribution structure 244, and the through dielectric vias 236 protrude with respect to such surface $S_{250}$ of the passivation layer 250. The passivation layer 250 may be formed of an insulating material, such as silicon nitride or silicon oxynitride.

Furthermore, in some embodiments, electrical connectors 252 are disposed at a side of the redistribution structure 244 facing away from the substrate 100 and the dielectric material 234. The electrical connectors 252 are electrically connected to the redistribution elements 248 in the redistribution structure 244, and may be functioned as inputs/outputs (I/Os) of the semiconductor package 20. Each of the electrical connectors 252 may include a conductive pillar 254 and a solder cap 256 covering a terminal of the conductive pillar 254. In some embodiments, the conductive pillars 254 are connected to the redistribution elements 248 through conductive vias 258 laterally surrounded by an additional passivation layer 260. In some embodiments, the additional passivation layer 260 is formed of silicon nitride, silicon oxynitride or an organic material such as polyimide.

According to some embodiments, the semiconductor package 20 is attached to another package component via the electrical connectors 252 by a flip chip bonding manner. For instance, the package component attached with the semiconductor package 20 may be a package substrate. However, the present disclosure is not limited to the attached package component.

By disposing the PDN including the power rails 118, TSVs 238 and the redistribution structure 244, the power and ground signals can be provided to the transistors 106 (embedded in the circuit structure CS1) from the back side of the substrate 100 via shorter paths, and cell size can be effectively reduced. Moreover, as will be further described, substrate thinning during manufacturing of the semiconductor package 20 can be well controlled by a dielectric layer patterned to form the dielectric material 234.

Figure 2B:
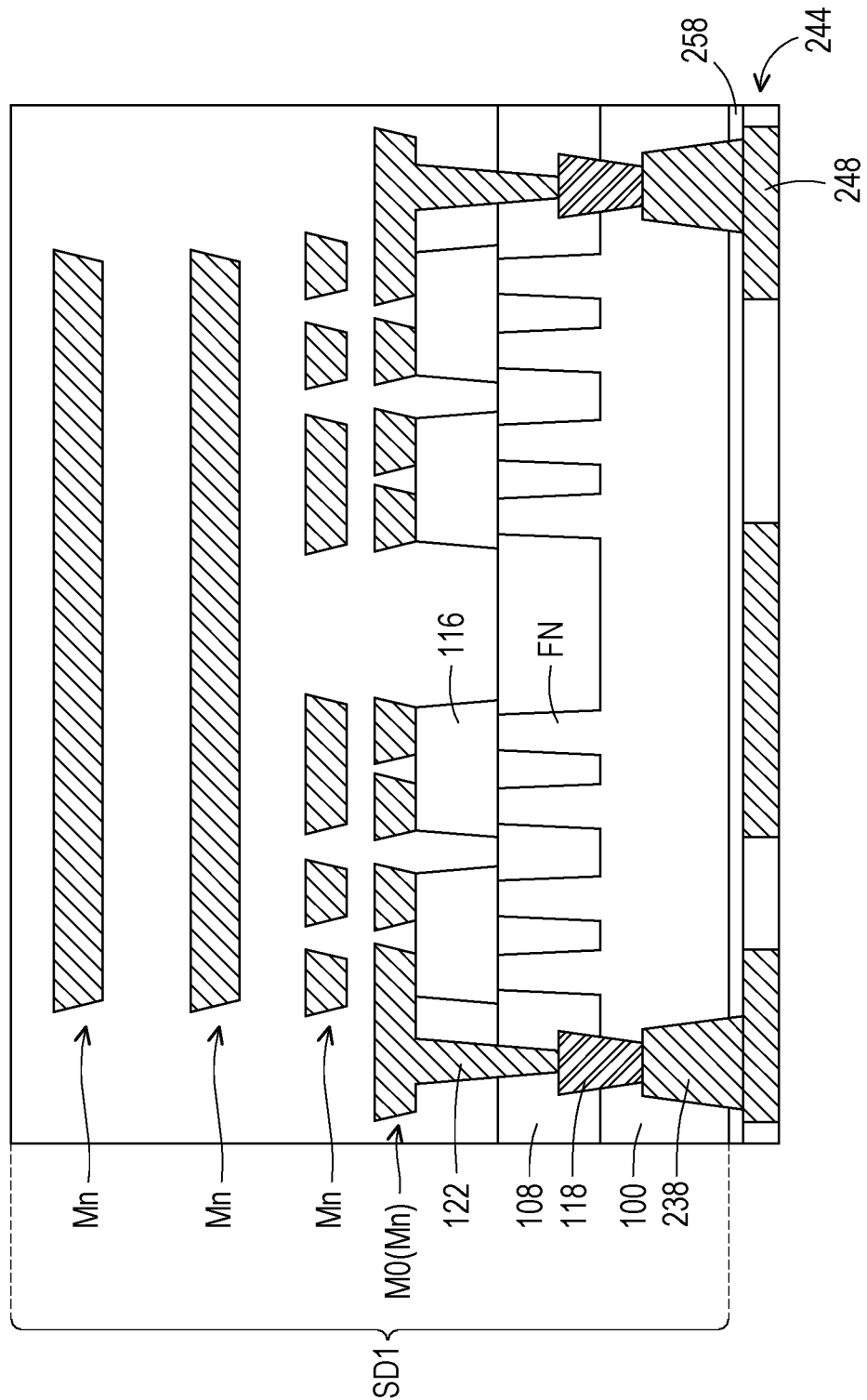
FIG. 2B is a schematic cross-sectional view illustrating a power distribution network (PDN) in the semiconductor package as shown in FIG. 2A.

FIG. 2B is a schematic cross-sectional view illustrating the PDN described with reference to FIG. 1A and FIG. 2A. Referring to FIG. 2B, according to some embodiments, the PDN including the redistribution elements 248, the TSVs 238, the power rails 118 and the contact plugs 122 spreads at the back side of the semiconductor die SD1, and extends through the substrate 100 and the isolation structure 108 of the semiconductor die SD1, to the metallization layers Mn of the semiconductor die SD1. As schematically illustrated in FIG. 2B, the PDN is connected to the source/drain structures 116 through the metallization layer M0.

Figure 3:
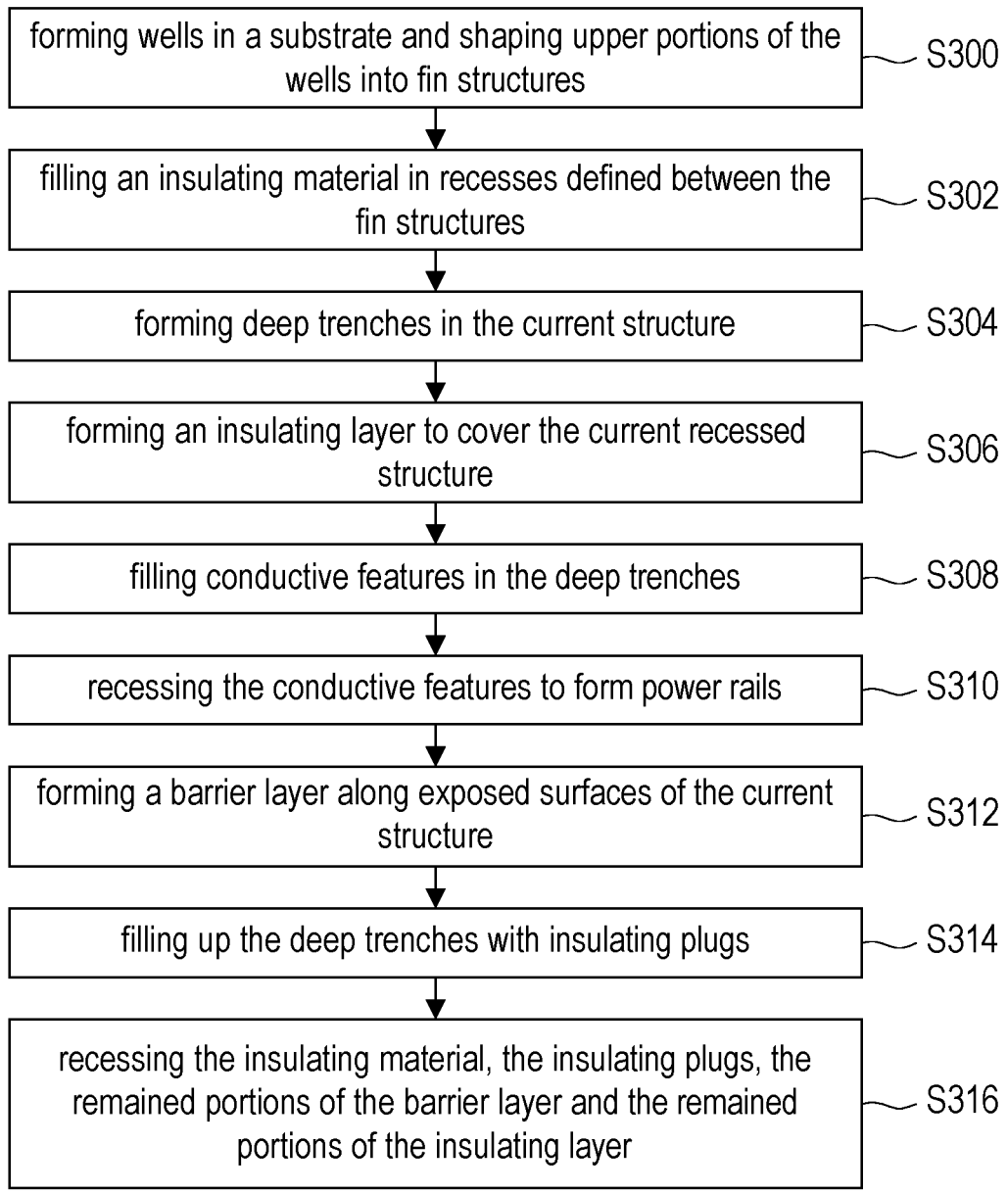
FIG. 3 is a flow diagram illustrating a part of a manufacturing process for forming the integrated circuit as shown in FIG. 1A.

FIG. 3 is a flow diagram illustrating a part of a manufacturing process for forming the integrated circuit 10 as shown in FIG. 1A. FIG. 4A through FIG. 4I are schematic cross-sectional views illustrating structures at various stages during the manufacturing process as shown in FIG. 3.

Figure 4B:
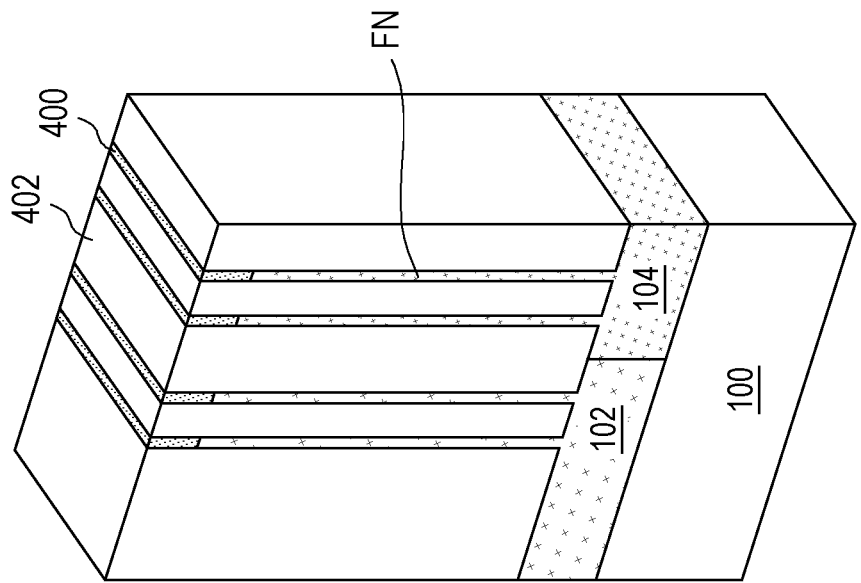
FIG. 4A through FIG. 4I are schematic cross-sectional views illustrating structures at various stages during the manufacturing process as shown in FIG. 3.
Figure 4A:
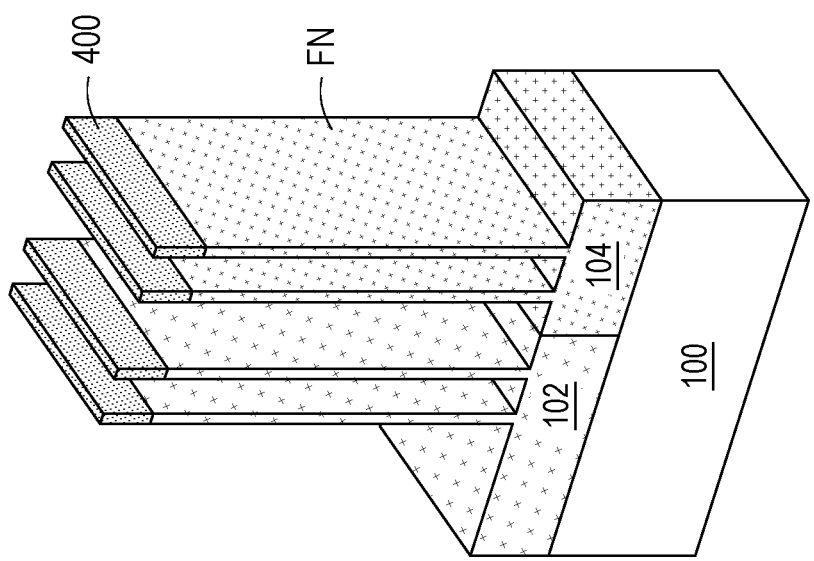

Referring to FIG. 3 and FIG. 4A, step S300 is performed, and the wells 102, 104 with upper portions shaped into the fin structures FN are formed in the substrate 100. The wells 102, 104 may be respectively formed by an ion implantation process. In addition, a method for shaping the upper portions of the wells 102, 104 into the fin structures FN may include at least one lithography process and at least one etching process. For instance, a self-aligned multiple patterning method (e.g., a self-aligned double patterning (SADP) method) including one lithography process and multiple etching processes may be used for forming the fin structures FN. Further, during formation of the fin structures FN, mask patterns 400 may be formed on the substrate 100, and may remain on the formed fin structures FN. Optionally, the mask patterns 400 may be removed in a subsequent process step.

Referring to FIG. 3 and FIG. 4B, step S302 is performed, and an insulting material 402 is filled in recesses defined between the fin structures FN. In those embodiments where the mask patterns 400 are remained on the fin structures FN, the insulating material 402 may be formed to a height substantially leveled with top surfaces of the mask patterns 400. According to some embodiments, a method for forming the insulating material 402 may include forming an initial insulating material to a height over the top surfaces of the mask patterns 400 by a deposition process (e.g., a chemical vapor deposition (CVD) process), and removing portions of the initial insulating material over the mask patterns 400 by a planarization process. The remained portions of the initial insulating material extending in between the fin structures FN form the insulating material 402. As examples, the planarization process described in the present disclosure may include a polishing process, an etching process or a combination thereof.

Figure 4C:
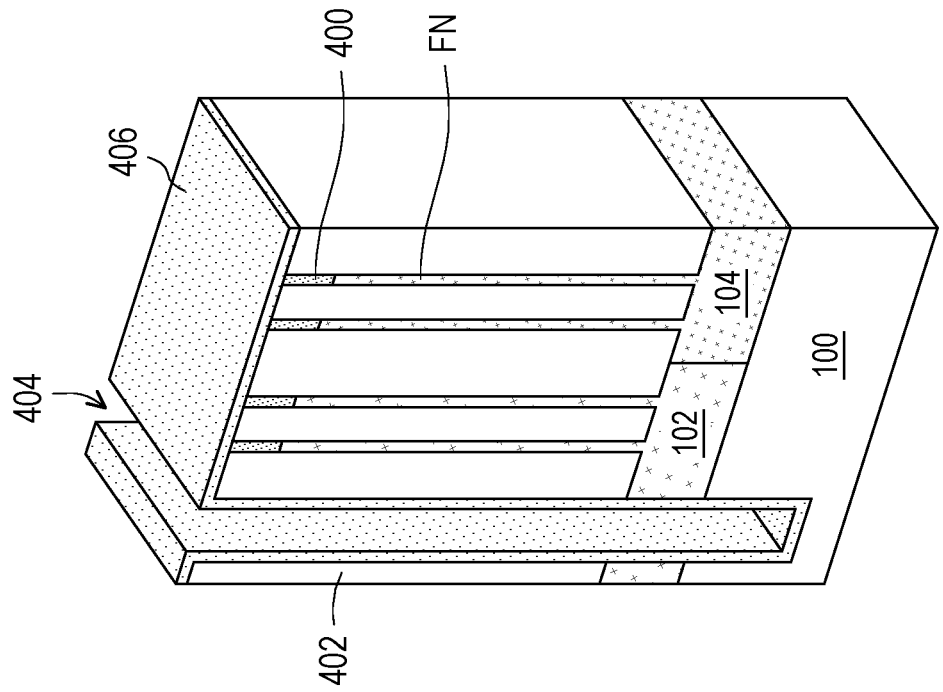

Referring to FIG. 3 and FIG. 4C, step S304 is performed, and deep trenches 404 (only one of them is shown) are formed into the current structure, for accommodating the power rails 118 to be formed in the following process steps. The deep trenches 404 penetrate through the insulating material 402, and extend into the substrate 400. According to some embodiments, the deep trenches 404 are substantially parallel with the fin structures FN. A method for forming the deep trenches 404 may include a lithography process and at least one etching process.

Figure 4D:
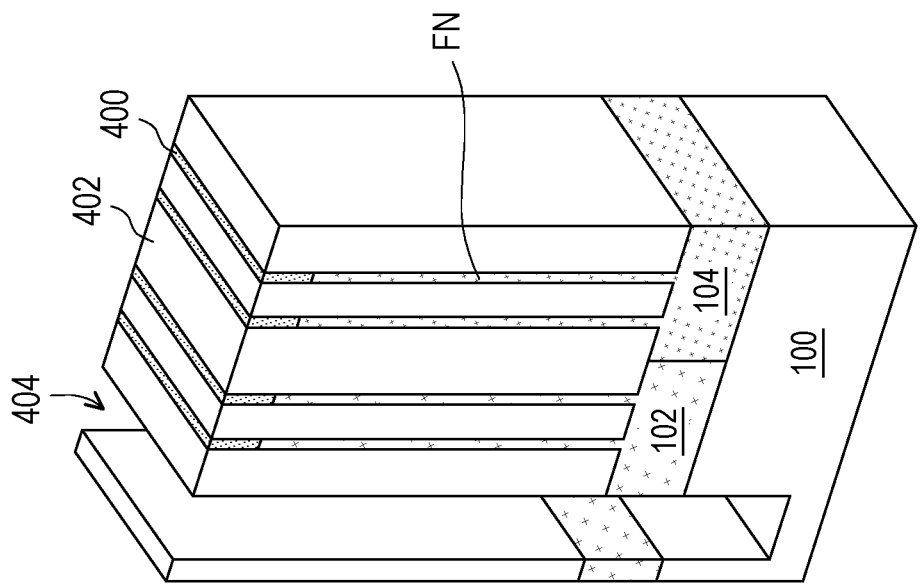

Referring to FIG. 3 and FIG. 4D, step S306 is performed, and an insulating layer 406 is formed on the current recessed structure. Bottom surfaces and sidewalls of the deep trenches 404 may be conformally covered by the insulating layer 406. In some embodiments, the insulating layer 406 further extends onto the top surface of the insulating material 402. In those embodiments where the fin structures FN are capped by the mask patterns 400, the mask patterns 400 may also be covered by the insulating layer 406. A method for forming the insulating layer 406 may include a deposition process, such as a CVD process.

Figure 4F:
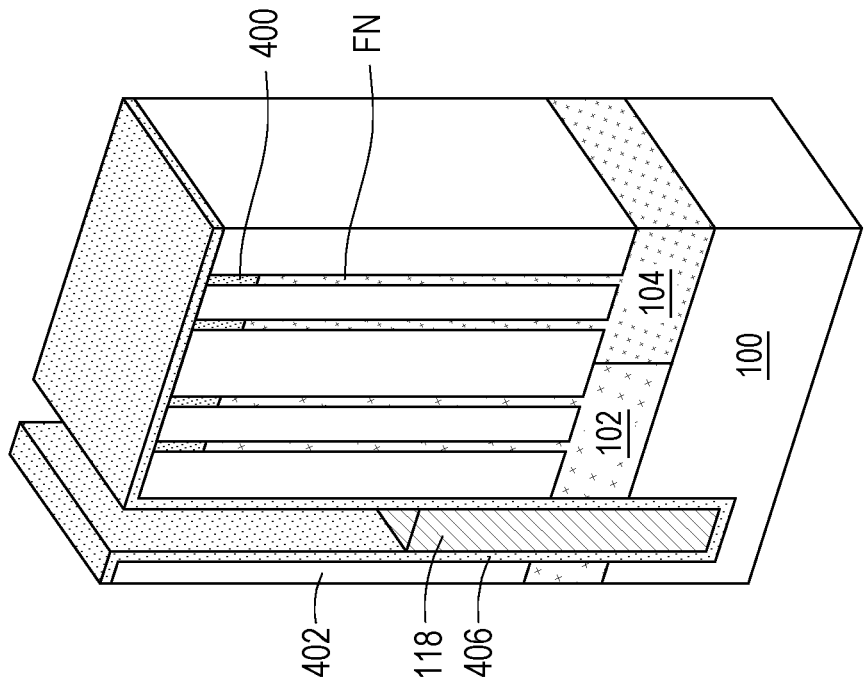
Figure 4E:
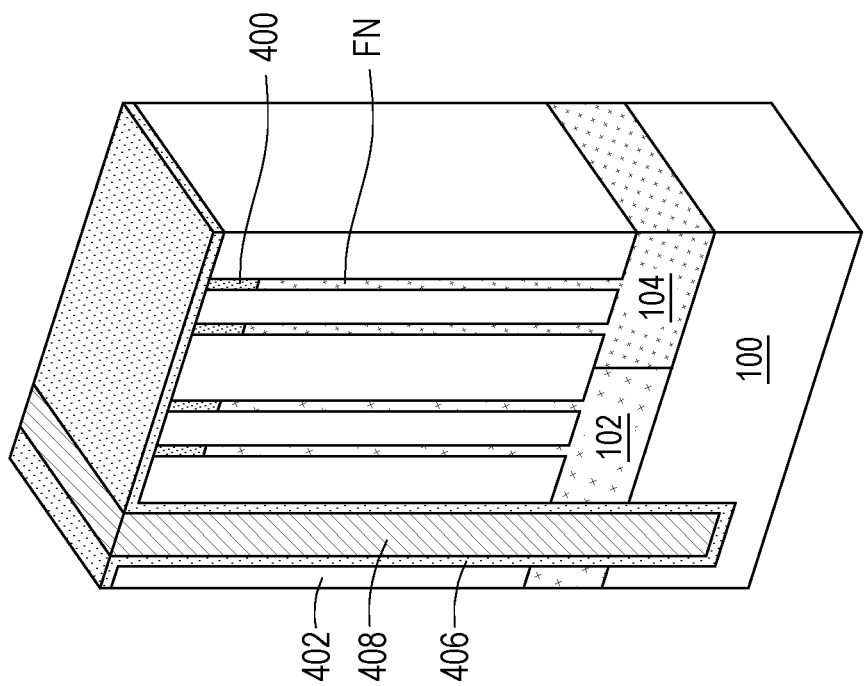

Referring to FIG. 3 and FIG. 4E, step S308 is performed, and conductive features 408 (only one of them is shown) are respectively filled in one of the deep trenches 404. In some embodiments, the conductive features 408 have top surfaces substantially coplanar with a topmost surface of the insulating layer 406. Although not shown, the conductive features 408 may respectively include a core conductor (e.g., tungsten) and an adhesion layer (e.g., titanium nitride layer) wrapping around and lying under the core conductor. According to some embodiments, a method for forming the conductive features 408 may include forming an initial adhesion layer globally and conformally covering the recessed structure shown in FIG. 4D, and forming a conductive material to cover the initial adhesion layer and fill up the deep trenches 404. The initial adhesion layer and the conductive material may be respectively formed by a deposition process. Thereafter, portions of the initial adhesion layer and the conductive material above the topmost surface of the insulating layer 406 may be removed by a planarization process. Remained portions of the initial adhesion layer in the deep trenches 404 may form the adhesion layers of the conductive features 408, and remained portions of the conductive material in the deep trenches 404 may form the core conductors of the conductive features 408.

Referring to FIG. 3 and FIG. 4F, step S310 is performed, and the conductive features 408 are recessed to form the power rails 118. Upper portions of the conductive features 408 may be removed by an etching process, while lower portions of the conductive features 408 remain and form the power rails 118. According to some embodiments, the conductive features 408 are selectively etched, with respect to the insulating layer 406. In these embodiments, the insulating layer 406 still extend above the remained portions of the conductive features 408 (i.e., the power rails 118).

Figure 4H:
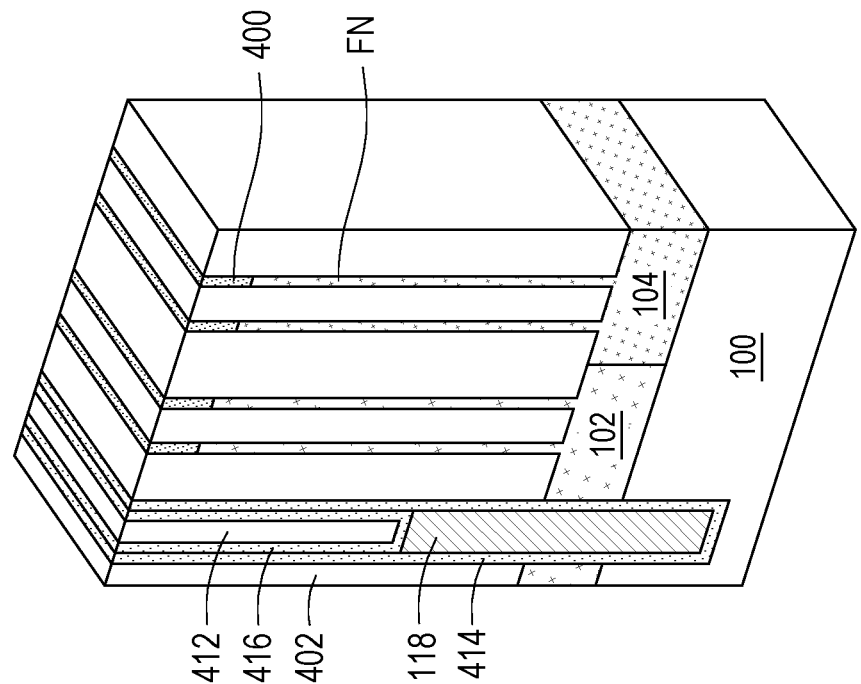
Figure 4G:
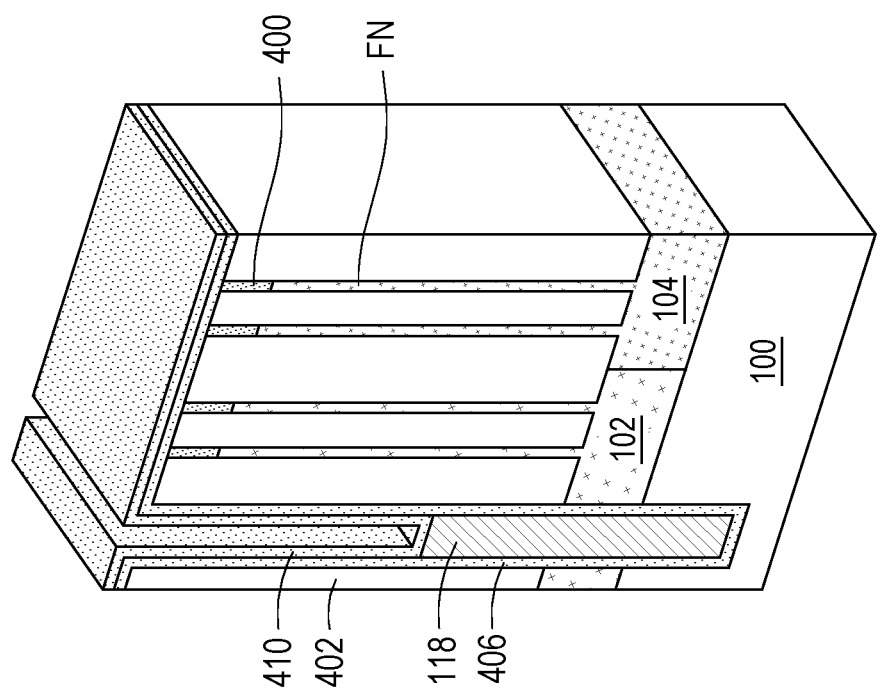

Referring to FIG. 3 and FIG. 4G, step S312 is performed, and a barrier layer 410 is formed. The barrier layer 410 may conformally extend along surfaces of the insulating layer 406, and may cover top surfaces of the power rails 118. The barrier layer 410 may be formed of an insulating layer, and may be formed by a deposition process, such as a CVD process. According to some embodiments, the insulating layer 406 and the barrier layer 410 are both formed of silicon nitride.

Referring to FIG. 3 and FIG. 4H, step S314 is performed, and insulating plugs 412 are formed to fill up the deep trenches 404. During formation of the insulating plugs 412, portions of the insulating layer 406 and the barrier layer 410 above the insulating material 402 and the mask patterns 400 may be removed, and the insulating material 402 as well as the mask patterns 400 may be exposed. Accordingly, the insulating layer 406 and the barrier layer 410 are respectively patterned into separate portions in the deep trenches 404. The remained portions of the insulating layer 406 are also referred to as insulating layers 414, and the remained portions of the barrier layer 410 are also referred to as barrier layers 416. The insulating plugs 412 standing on the power rails 118 are wrapped around by the insulating layer 414 and the barrier layer 416, and are separated from the power rails 118 by the barrier layers 416. According to some embodiments, a method for forming the insulating plugs 412 includes providing an insulating material on the structure as shown in FIG. 4G by a deposition process, such as a CVD process. The insulating material may fill up the deep trenches 404, and extend over a topmost surface of the barrier layer 410. Subsequently, portions of the insulating material, the barrier layer 410 and the insulating layer 406 above the insulating material 402 may be removed by a planarization process, such that the insulating material, the barrier layer 410 and the insulating layer 406 are patterned to form the insulating plugs 412, the barrier layers 416 and the insulating layers 414.

Figure 4I:
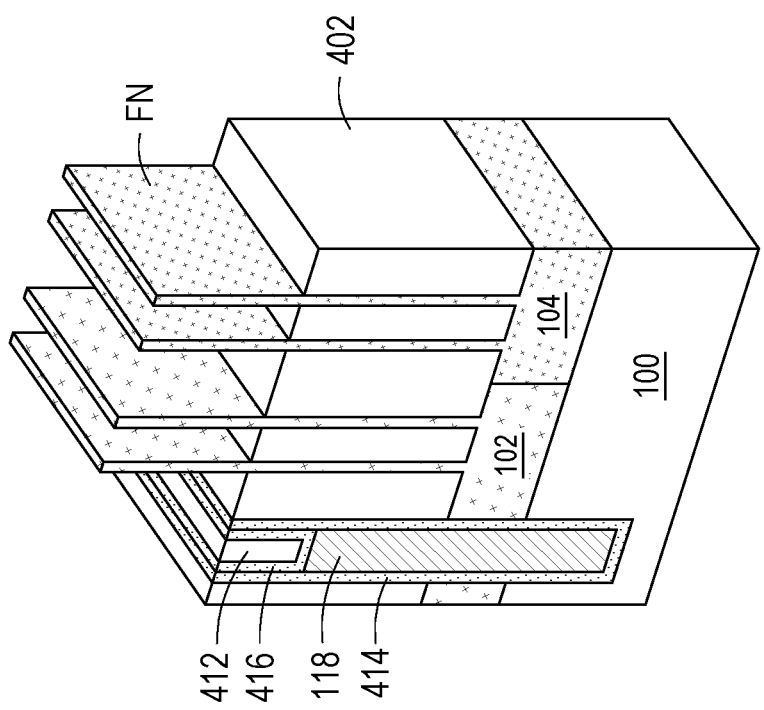

Referring to FIG. 3 and FIG. 4I, step S316 is performed, and the insulating material 402, the insulating plugs 412, the barrier layers 416 and the insulating layers 414 are recessed with respect to the fin structures FN. The insulating material 402 is recessed to form the isolation structure 108 as described with reference to FIG. 1A. The insulating layers 120 each described with reference to FIG. 1A may be lower portions of the recessed insulating layers 414. On the other hand, the recessed insulating plugs 412 and barrier layers 416 are not shown in FIG. 1A. Further, the mask patterns 400 may be removed while recessing the insulating material 402, the insulating plugs 412, the barrier layers 416 and the insulating layers 414. According to some embodiments, a method for recessing the insulating material 402, the insulating plugs 412, the barrier layers 416 and the insulating layers 414 includes an etching process.

Figure 4J:
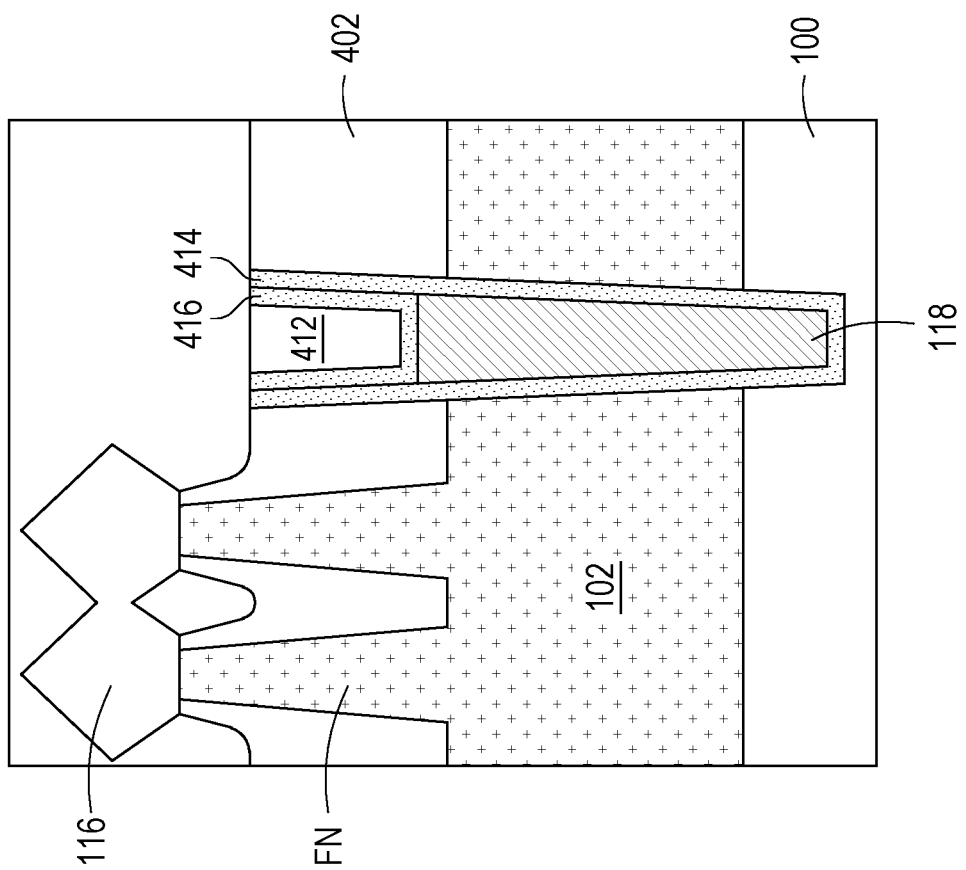
FIG. 4J is a schematic cross-sectional view illustrating formation of source/drain structures, according to some embodiments of the present disclosure.

Up to here, the power rails 118 and surrounding components are formed. FIG. 4J is a schematic cross-sectional view illustrating formation of the source/drain structures 116, according to some embodiments of the present disclosure. Referring to FIG. 4J, portions of the fin structures FN are recessed, and the source/drain structures 116 are formed on the recessed portions of the fin structures FN. According to some embodiments, top surfaces of the recessed portions of the fin structures FN are still higher than the top surfaces of the power rails 118, and may be still higher than the top surfaces of the insulating layers 414, the barrier layers 416 and the insulating plugs 412.

The current structure can be further processed to form the integrated circuit 10 as described with reference to FIG. 1A. In addition, a semiconductor die can be formed based on the integrated circuit 10, and such semiconductor die can be bonded to another semiconductor die during a packaging process to form the semiconductor package 20 as described with reference to FIG. 2A.

Figure 5:
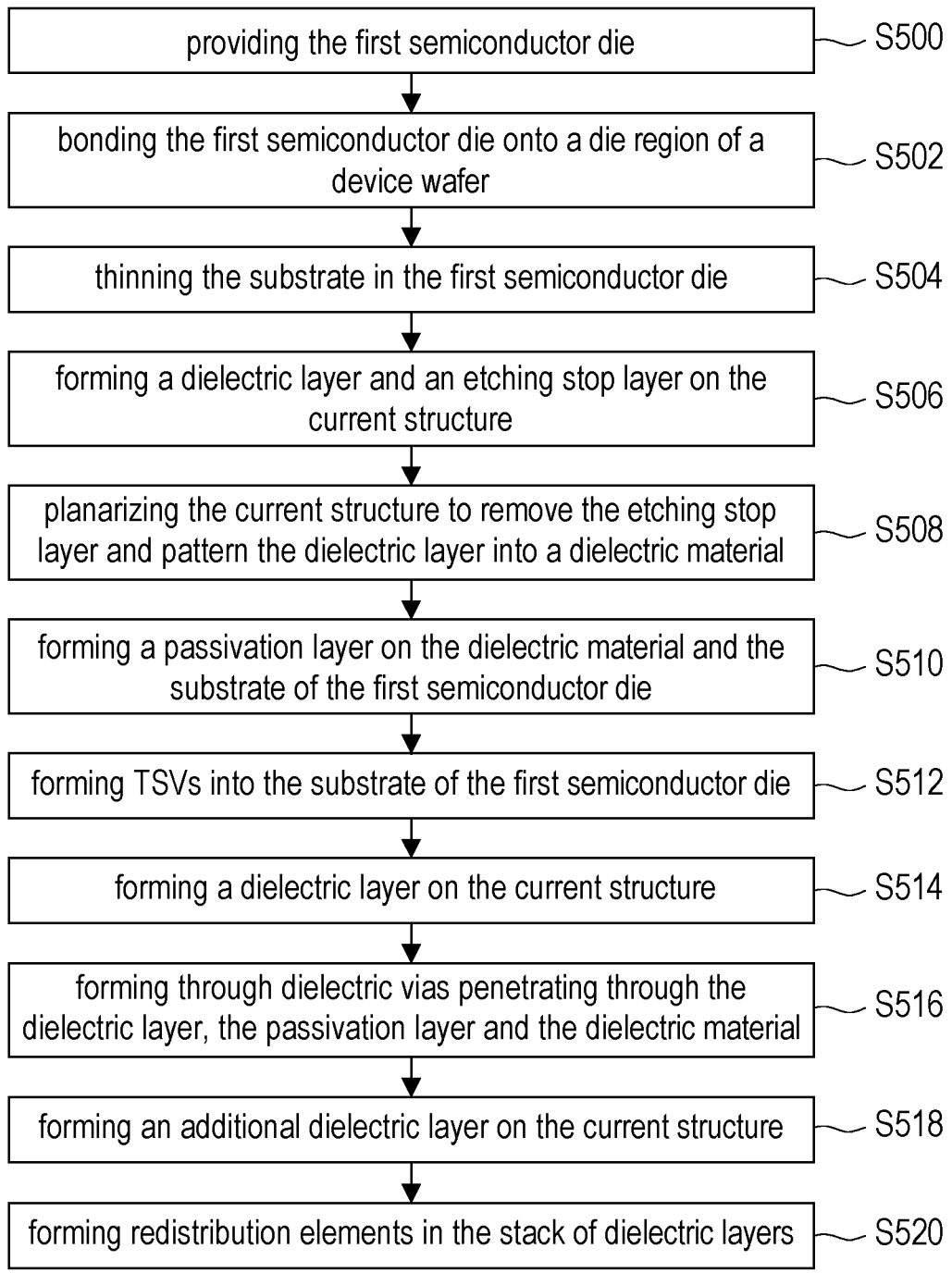
FIG. 5 is a flow diagram illustrating a part of a manufacturing process for forming the semiconductor package as shown in FIG. 2A.

FIG. 5 is a flow diagram illustrating a part of a manufacturing process for forming the semiconductor package 20 as shown in FIG. 2A. FIG. 6A through FIG. 6K are schematic cross-sectional views illustrating structures at various stages during the manufacturing process shown in FIG. 5.

Figure 6A:
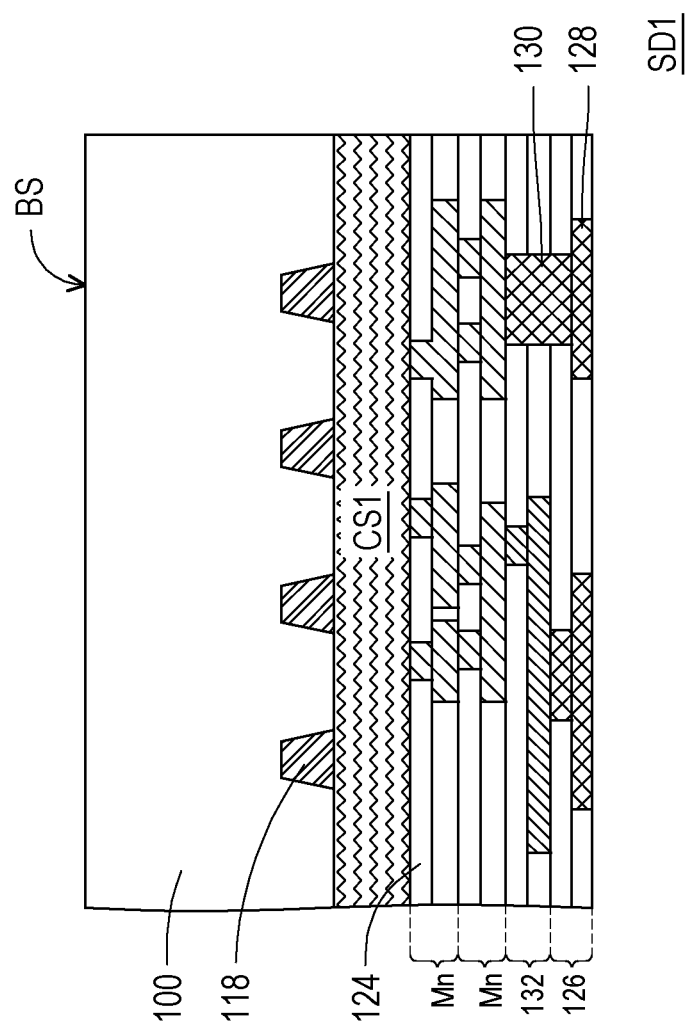
FIG. 6A through FIG. 6K are schematic cross-sectional views illustrating structures at various stages during the manufacturing process shown in FIG. 5.

Referring to FIG. 5 and FIG. 6A, step S500 is performed, and the first semiconductor die SD1 including the integrated circuit 10 is provided. Currently, the substrate 100 of the first semiconductor die SD1 has not been thinned. In addition, the first semiconductor die SD1 may be provided with the back surface BS of the substrate 100 facing upwardly.

Figure 6B:
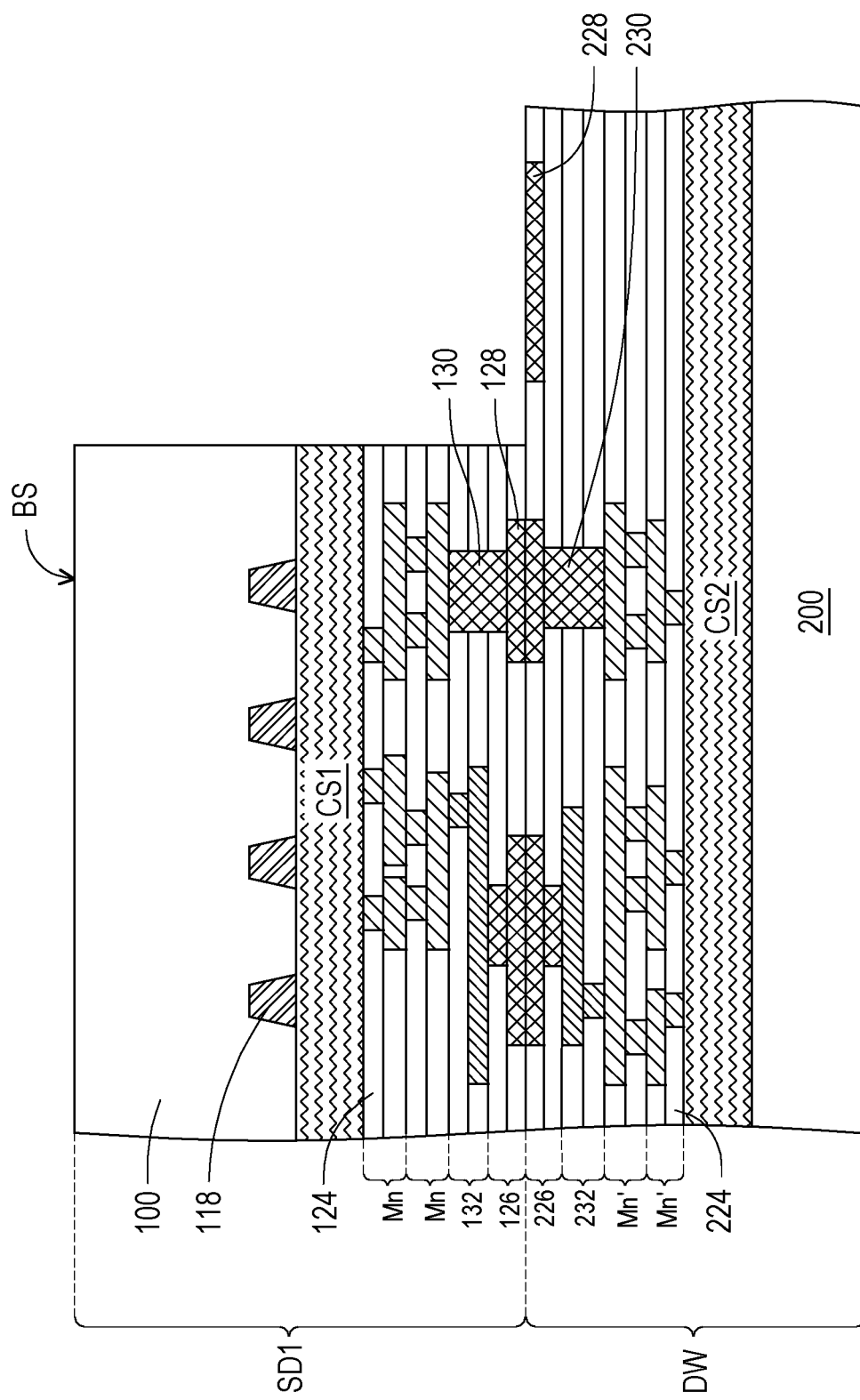

Referring to FIG. 5 and FIG. 6B, step S502 is performed, and the first semiconductor die SD1 is bonded onto a die region of a device wafer DW. The die region will be singulated to form the second semiconductor die SD2. The first semiconductor die SD1 and the device wafer DW are bonded with each other by a hybrid bonding manner. The bonding pads 128 of the first semiconductor die SD1 are bonded with at least some of the bonding pads 228 in the die region of the device wafer DW, while the dielectric layer 124 laterally surrounding the bonding pads 128 is bonded with the dielectric layer 224 laterally surrounding the bonding pads 228. Further, the die region of the device wafer DW may be larger than the first semiconductor die SD1, and a central portion of the die region is bonded with the first semiconductor die SD1, while a peripheral portion of the die region may not be overlapped with the first semiconductor die SD1. Accordingly, a step with a step height substantially equal to a height of the first semiconductor die SD1 is defined along boundary of the first semiconductor die SD1.

Figure 6C:
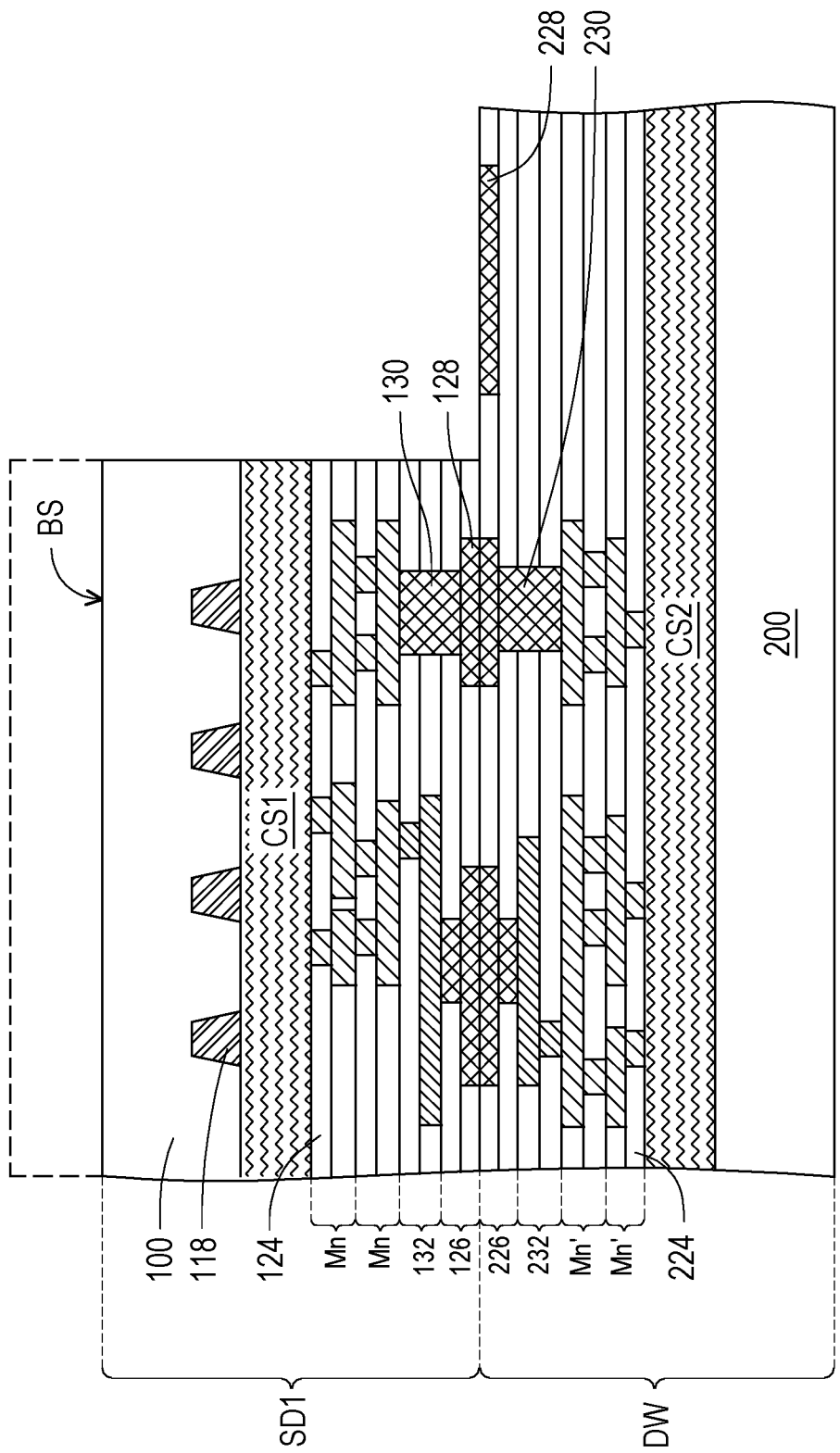

Referring to FIG. 5 and FIG. 6C, step S504 is performed, and the substrate 100 is thinned. In some embodiments, the substrate 100 is thinned by grinding the substrate 100 from the back surface BS of the substrate 100. A region enclose by dash lines in FIG. 6C indicates the portion of the substrate 100 being removed during the thinning process.

Figure 6D:
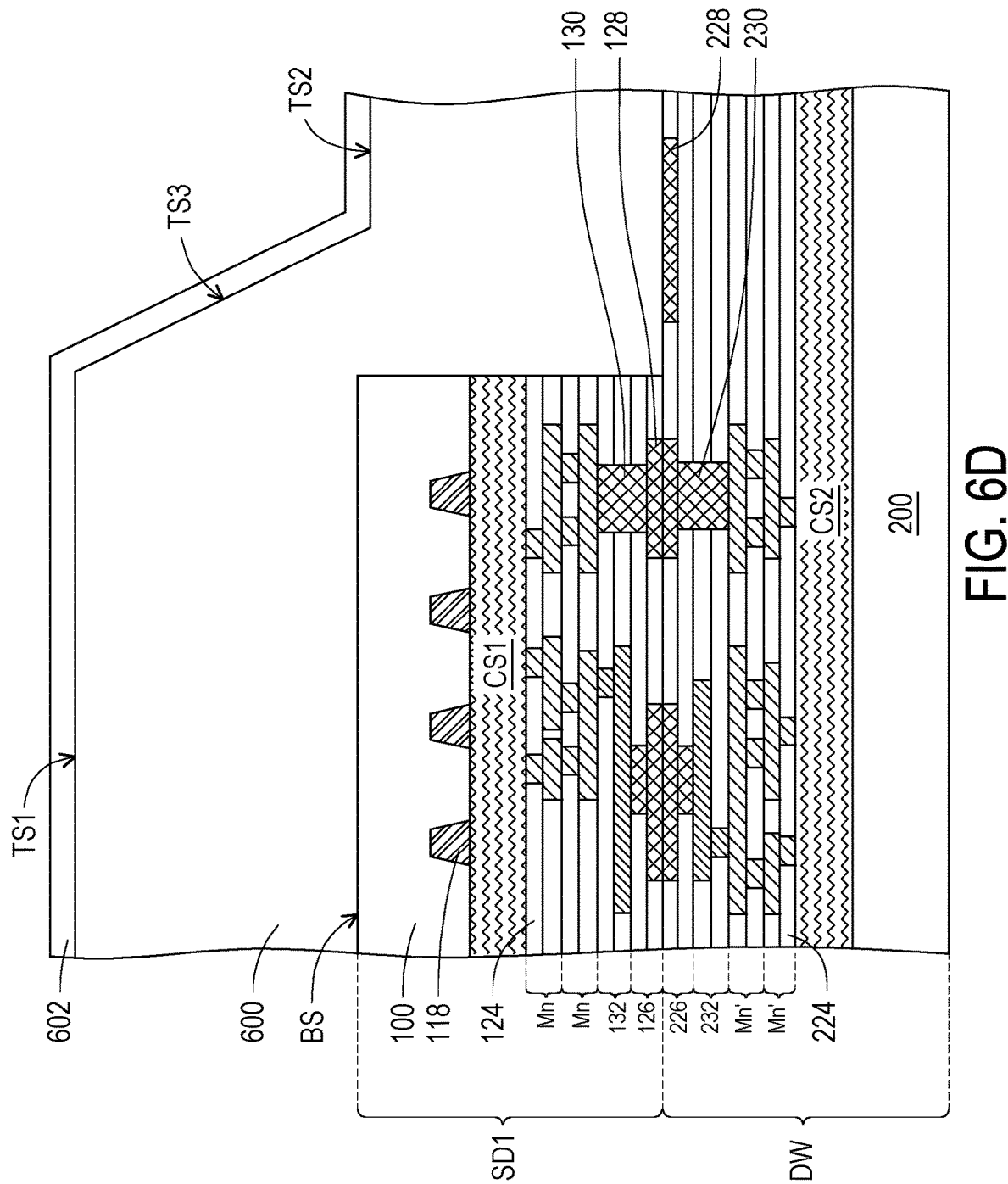

Referring to FIG. 5 and FIG. 6D, step S506 is performed, and a dielectric layer 600 and an etching stop layer 602 are formed on the current structure. The dielectric layer 600 is thick enough to extend across the step defined along the boundary of the first semiconductor die SD1. In some embodiments, the dielectric layer 600 has an upper top surface TS1, a lower top surface TS2 and a sloped top surface TS3 extending between the upper top surface TS1 and the lower top surface TS2. The upper top surface TS1 is higher than the back surface BS of the substrate 100, whereas the lower top surface TS2 may be slightly lower than the back surface BS of the substrate 100. Alternately, the lower top surface TS2 may be leveled with or slightly higher than the back surface BS of the substrate 100. Inclination of the sloped top surface TS3 is dependent on a height difference between the upper top surface TS1 and the lower top surface TS2. According to some embodiments, the etching stop layer 602 conformally covers the dielectric layer 600, and extends along the upper top surface TS1, the sloped top surface TS3 and the lower top surface TS2 of the dielectric layer 600. In addition, in some embodiments, the etching stop layer 602 is formed by a dielectric material different from a dielectric material for forming the dielectric layer 600. For instance, the dielectric layer 600 may be formed of tetraethoxysilane (TEOS), whereas the etching stop layer 602 may be formed of silicon nitride or silicon oxynitride. The dielectric layer 600 and the etching stop layer 602 may respectively be formed by a deposition process, such as a CVD process.

Figure 6E:
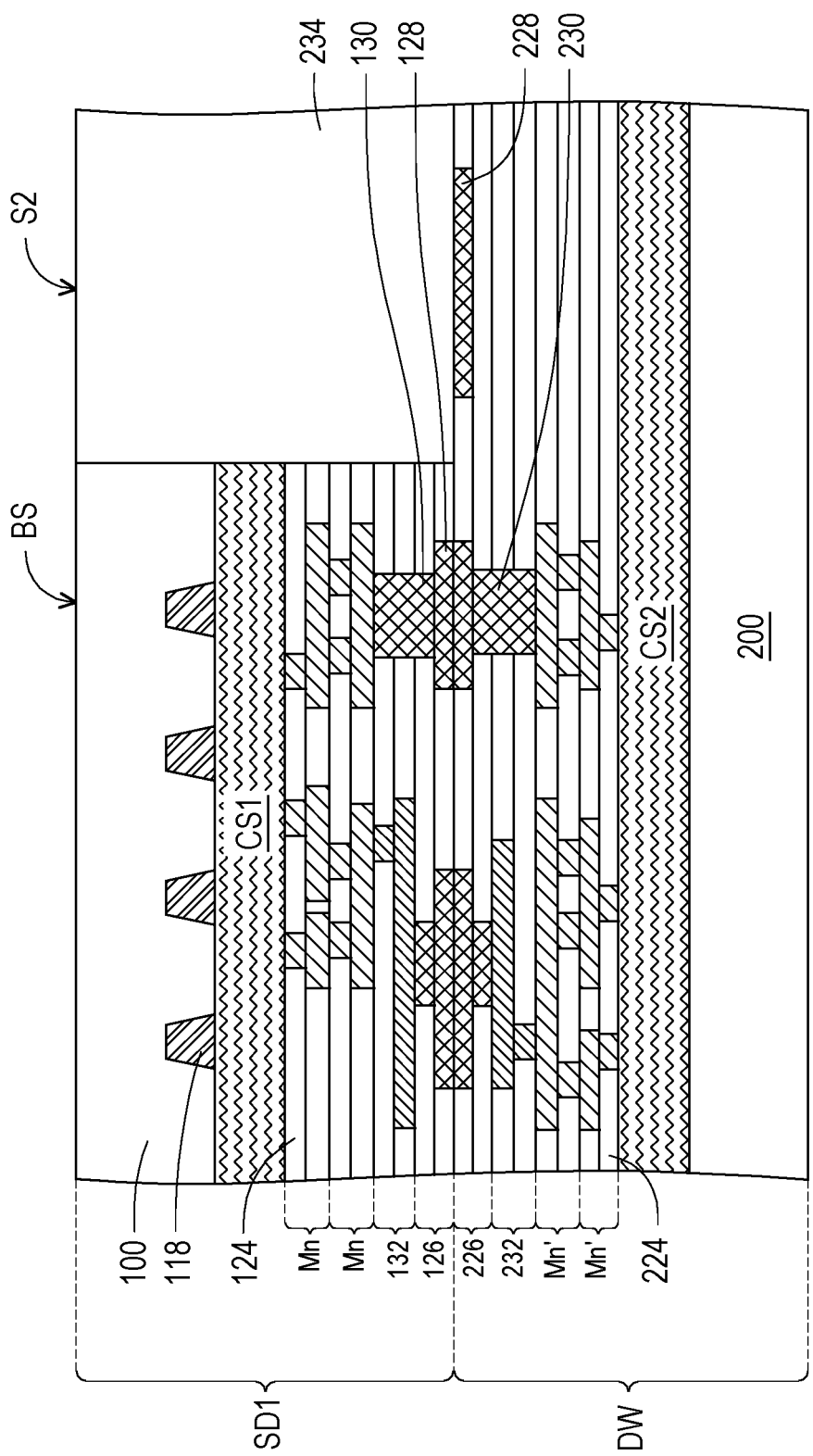

Referring to FIG. 5, FIG. 6D and FIG. 6E, step S508 is performed, and the current structure is planarized. Initially, portions of the dielectric layer 600 and the etching stop layer 602 above the back surface BS of the substrate 100 are removed. Thereafter, remained portion of the etching stop layer 602 may be removed, and remained portion of the dielectric layer 600 may be planarized and thinned till the lower top surface TS2 is exposed. The eventually remained portion of the dielectric layer 600 forms the dielectric material 234. Meanwhile, the substrate 100 may be further thinned, and the back surface BS of the substrate 100 may be lowered to a height substantially leveled with a top surface of the dielectric material 234 (i.e., the lower top surface TS2 of the dielectric layer 600 as shown in FIG. 6D). In other words, the further thinning of the substrate 100 may end at exposure of the lower top surface TS2 of the dielectric layer 600. Therefore, the eventual thickness of the substrate 100 can be determined by a height of the lower top surface TS2 of the dielectric layer 600. As compared to using a substrate having an etching stop layer sandwiched between a bulk semiconductor and a thin semiconductor layer for controlling thinning of the substrate, the substrate 100 can be precisely thinned by a simple process according to embodiments of the present disclosure without limiting to a certain substrate type.

Figure 6F:
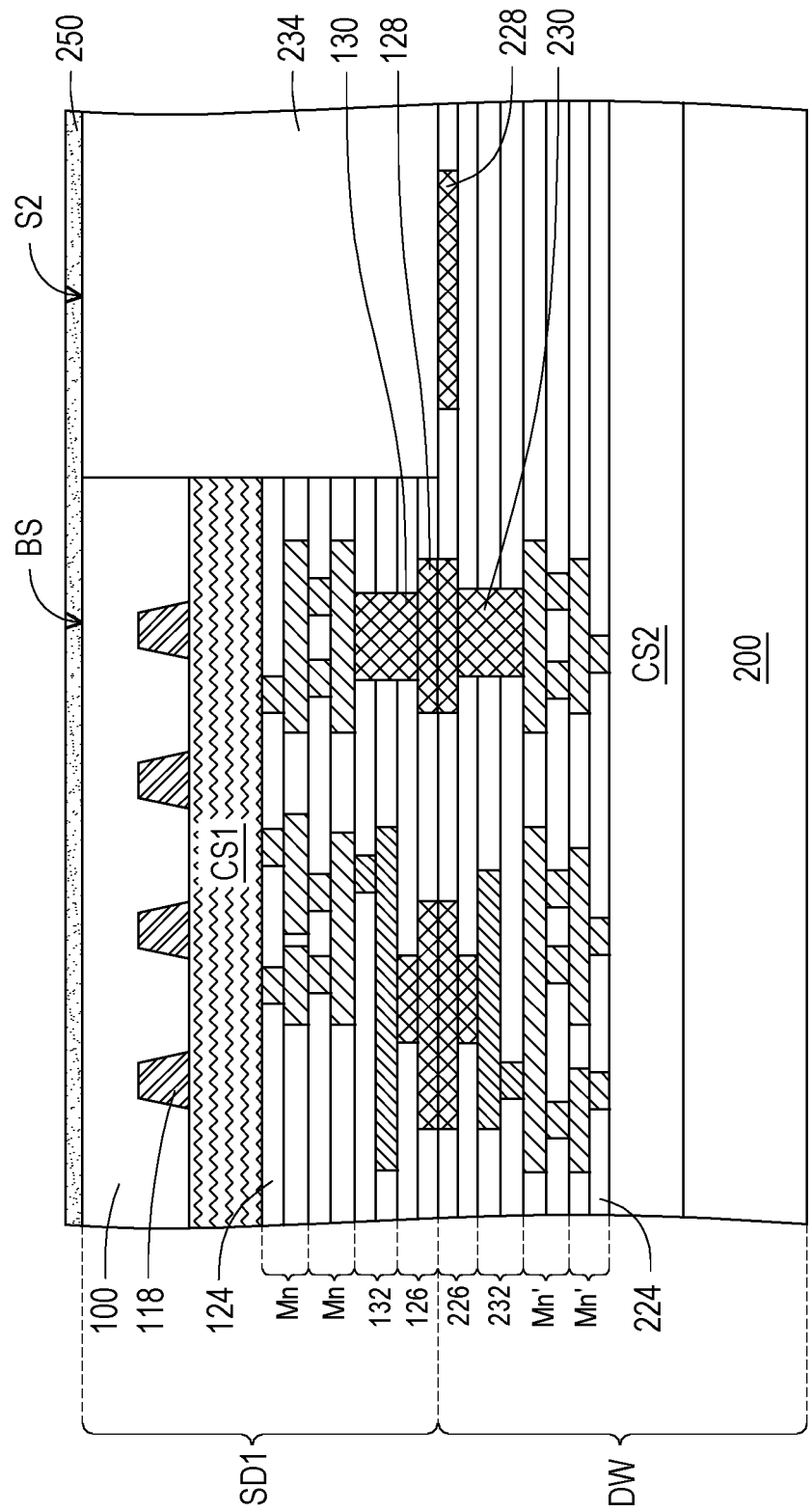

Referring to FIG. 5 and FIG. 6F, step S510 is performed, and the passivation layer 250 is formed on the substrate 100 and the dielectric material 234. As a result, the back surface BS of the substrate 100 as well as the second surface S2 of the passivation layer 250 substantially leveled with the back surface BS of the substrate 100 are covered by the passivation layer 250. In some embodiments, a method for forming the passivation layer 250 includes a deposition process, such as a CVD process.

Figure 6G:
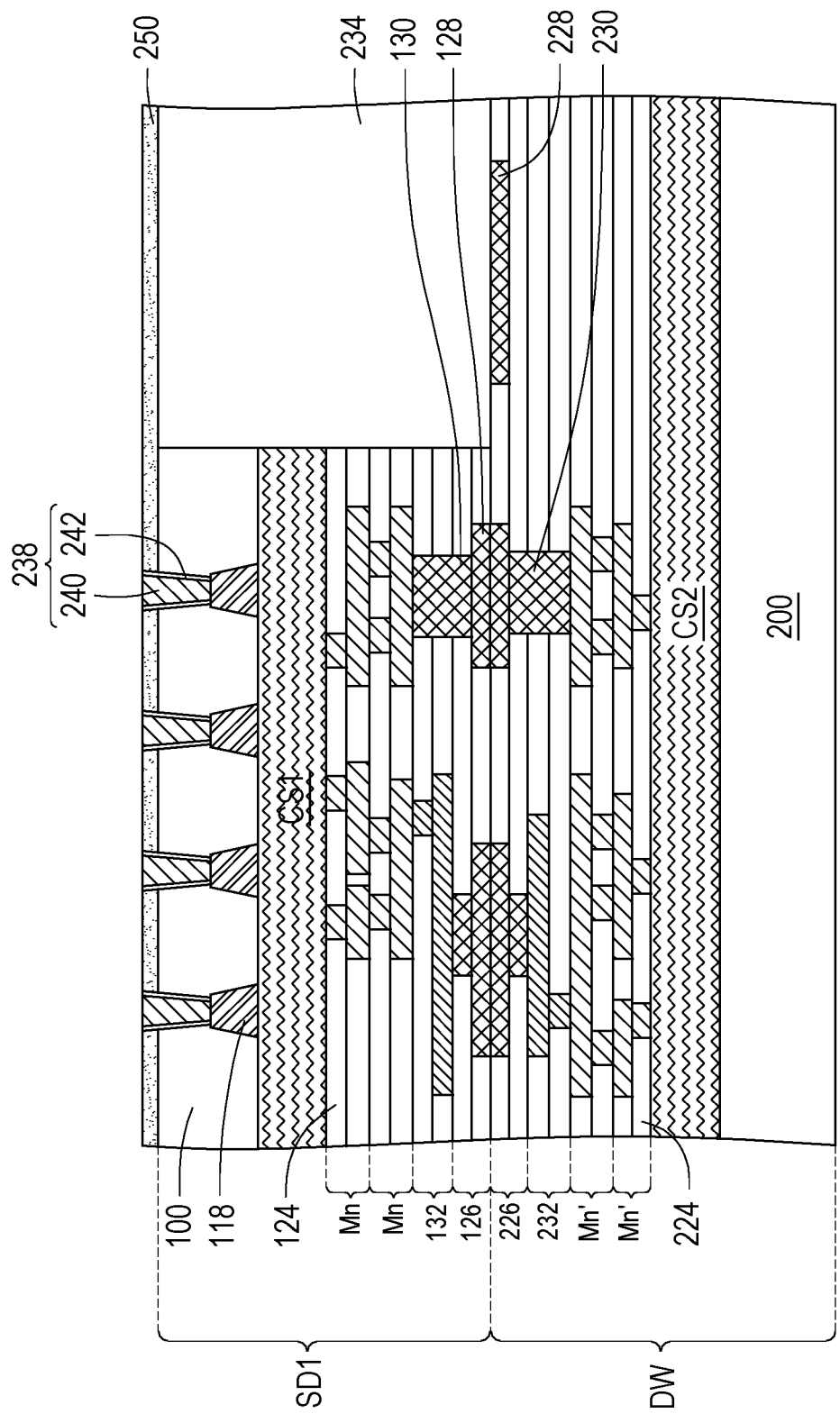

Referring to FIG. 5 and FIG. 6G, step S512 is performed, and the TSVs 238 are formed into the substrate 100. According to some embodiments, formation of the TSVs 238 includes forming openings extending to the power rails 118 through the substrate 100 and the passivation layer 250 by a lithography process and at least one etching process. Thereafter, an initial barrier layer may be conformally formed along the current recessed structure. Optionally, portions of the initial barrier layer in contact with the power rails 118 may be removed by a further etching process. Afterwards, a conductive material covering the initial barrier and filling up the openings is formed. Further, portions of the initial barrier layer and the conductive material above the passivation layer 250 are removed. As a result, portions of the initial barrier layer remained in the openings form the barrier layers 242, while portions of the conductive material remained in the openings form the through vias 240. The initial barrier layer may be formed by a deposition process, such as a CVD process. The conductive material may be formed by a deposition process (e.g., a PVD process or a CVD process), a plating process or a combination thereof. In addition, the initial barrier layer and the conductive material may be patterned by using a planarization process.

Figure 6H:
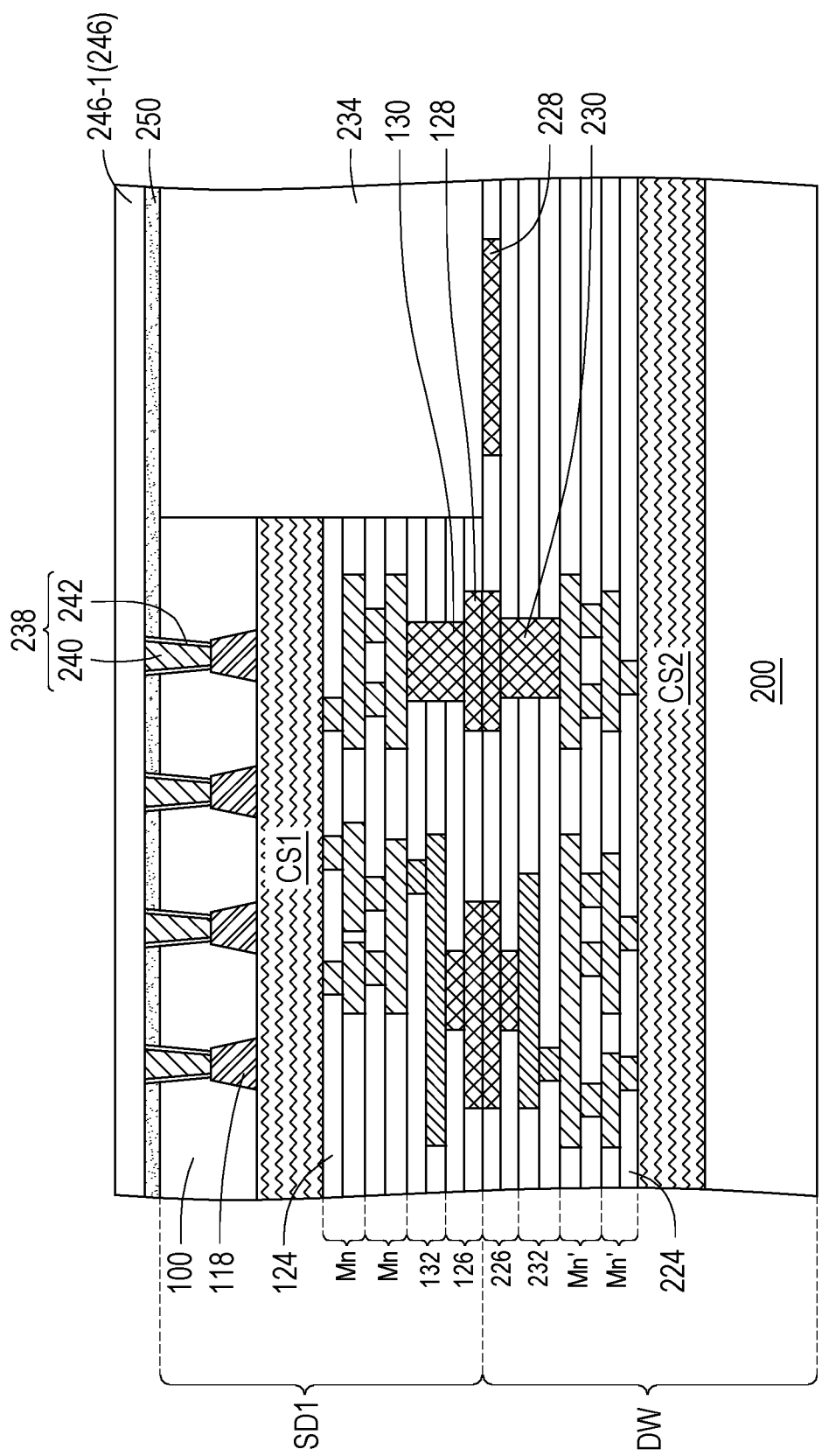

Referring to FIG. 5 and FIG. 6H, step S514 is performed, and one of the dielectric layers 246 (which is referred to as the dielectric layer 246-1) is formed on the current structure. As a result, the passivation layer 250 and the TSVs 238 are covered by the dielectric layer 246-1. In some embodiments, the dielectric layer 246-1 is formed by a deposition process, such as a CVD process).

Figure 6I:
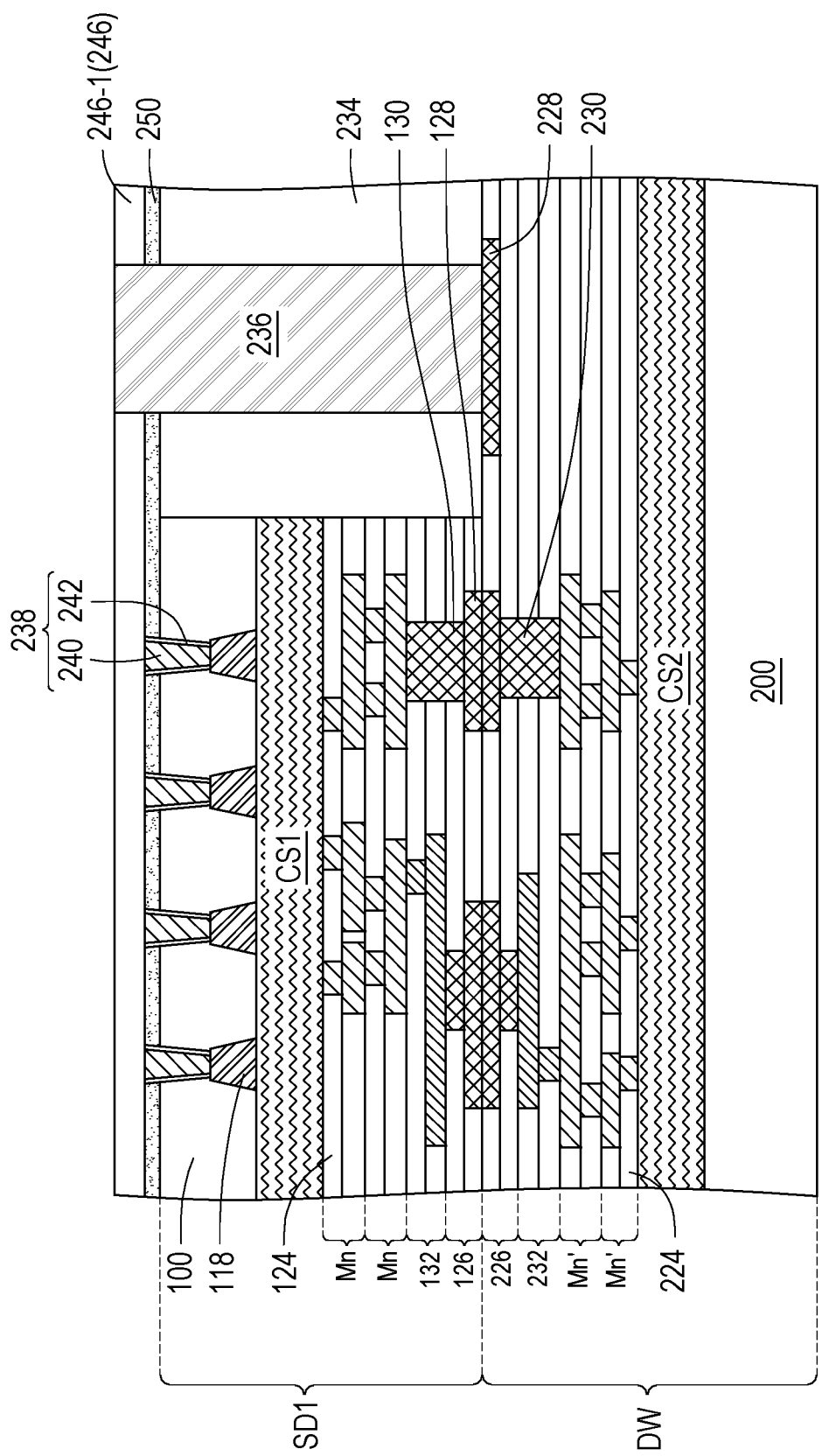

Referring to FIG. 6 and FIG. 6I, step S516 is performed, and the through dielectric vias 236 (only one of them is shown) are formed through the dielectric layer 246-1, the passivation layer 250 and the dielectric material 234. According to some embodiments, a method for forming the through dielectric vias 236 includes forming through holes penetrating through the dielectric layer 246-1, the passivation layer 250 and the dielectric material 234 by a lithography process and at least one etching process. Subsequently, a conductive material may be formed by a deposition process (e.g., a PVD process or a CVD process), a plating process or a combination thereof, to fill up the through holes and cover the dielectric layer 246-1. Afterwards, portions of the conductive material above the dielectric layer 246-1 may be removed by a planarization process, and portions of the conductive material remained in the through holes form the through dielectric vias 236.

Figure 6J:
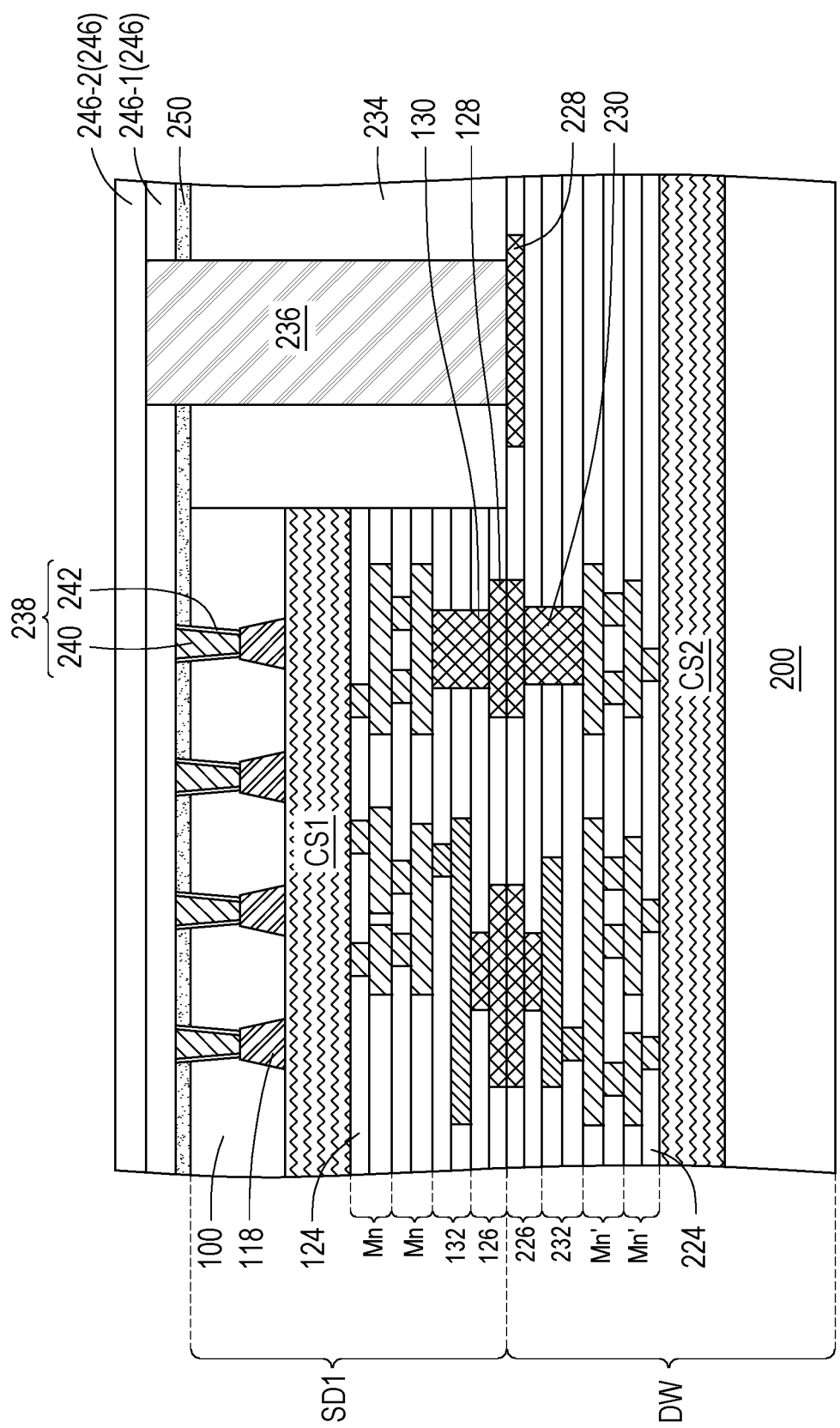

Referring to FIG. 5 and FIG. 6J, step S518 is performed, and an additional dielectric layer 246 (which is referred to as a dielectric layer 246-2) is formed on the current structure. As a result, the dielectric layer 246-1 and the through dielectric vias 236 are covered. In some embodiments, a method for forming the additional dielectric layer 246-2 is formed by a deposition process, such as a CVD process.

Figure 6K:
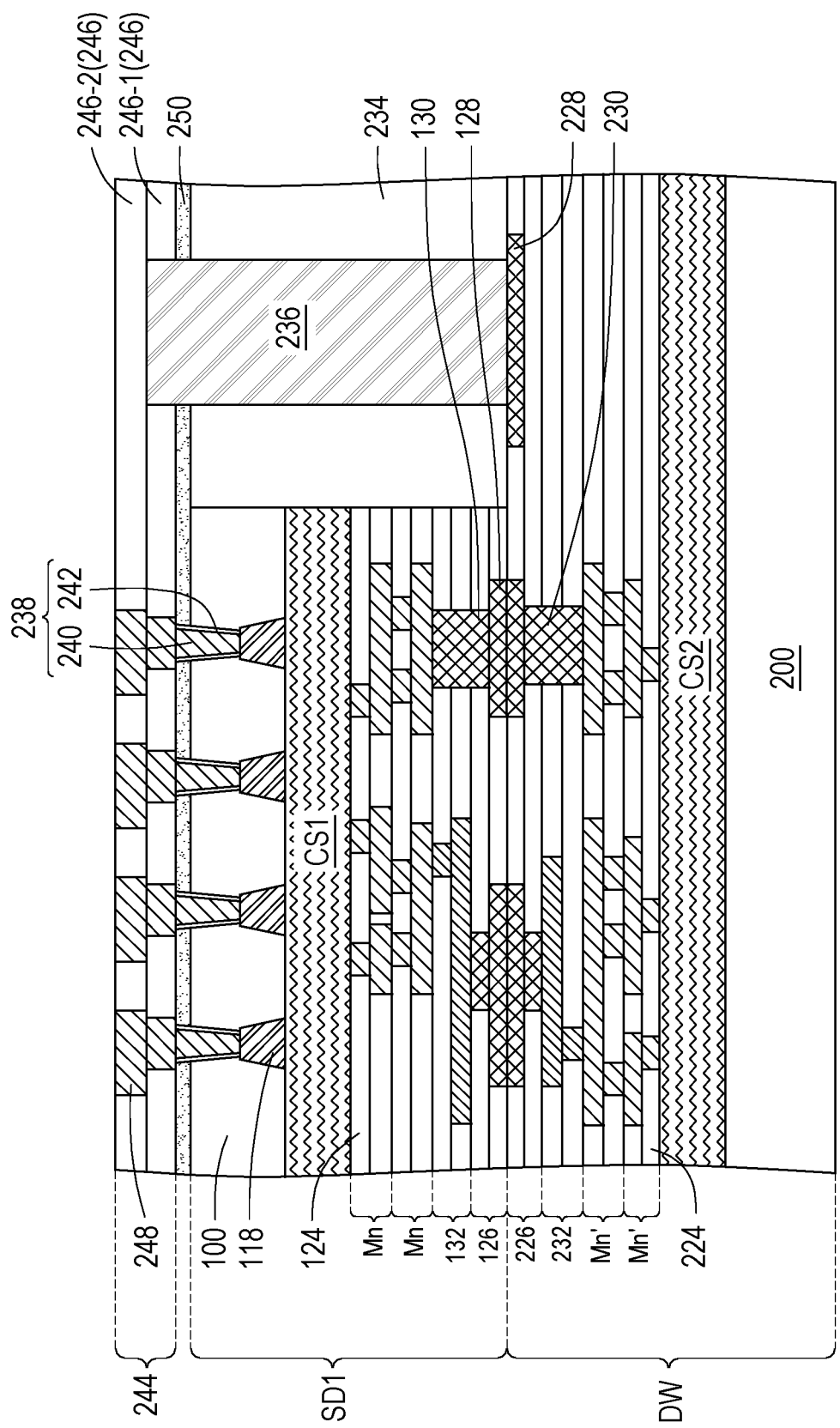

Referring to FIG. 5 and FIG. 6K, step S520 is performed, and the redistribution elements 248 are formed in the stack of dielectric layers 246-1, 246-2. According to some embodiments, the redistribution elements 248 are formed by a damascene process. In these embodiments, trenches and vias are formed in the dielectric layers 246-1, 246-2 by lithography processes and etching processes. Subsequently, a conductive material is formed by a deposition process, a plating process or a combination thereof, to fill up the trenches and vias, and to cover the dielectric layer 246-2. Thereafter, portions of the conductive material above the dielectric layer 246-2 are removed by a planarization process, and portions of the conductive material remained in the trenches and vias form the redistribution elements 248.

In those embodiments where the redistribution structure 244 includes more dielectric layers 246 and redistribution elements 248, the deposition of dielectric layer and the damascene process may be repeated till the entire redistribution structure 244 is formed. Further, the current structure may be further processed to form the semiconductor package 20 as described with reference to FIG. 2A. The further processes may include (but not limited to) forming the electrical connectors 252, the passivation layer 260 and the through conductive vias 258 on the redistribution structure 244, and a possible singulation. As a result of such singulation process, the redistribution structure 244 and the dielectric material 234 are cut along boundary of the die region in the device wafer DW, and the die region in the device wafer DW is singulated to form the second semiconductor die SD2. Accordingly, a sidewall of the redistribution structure 244 and an outer sidewall of the dielectric material 234 can be substantially coplanar with a sidewall of the second semiconductor die SD2.

As described above, the eventual thickness of the substrate 100 can be dependent on a thickness of the dielectric layer 600 to be patterned to form the dielectric material 234, thus thinning of the substrate 100 can be well controlled without limited to a certain substrate type. Accordingly, the semiconductor package 20 can be manufactured by a rather cost-effective process.

Figure 7:
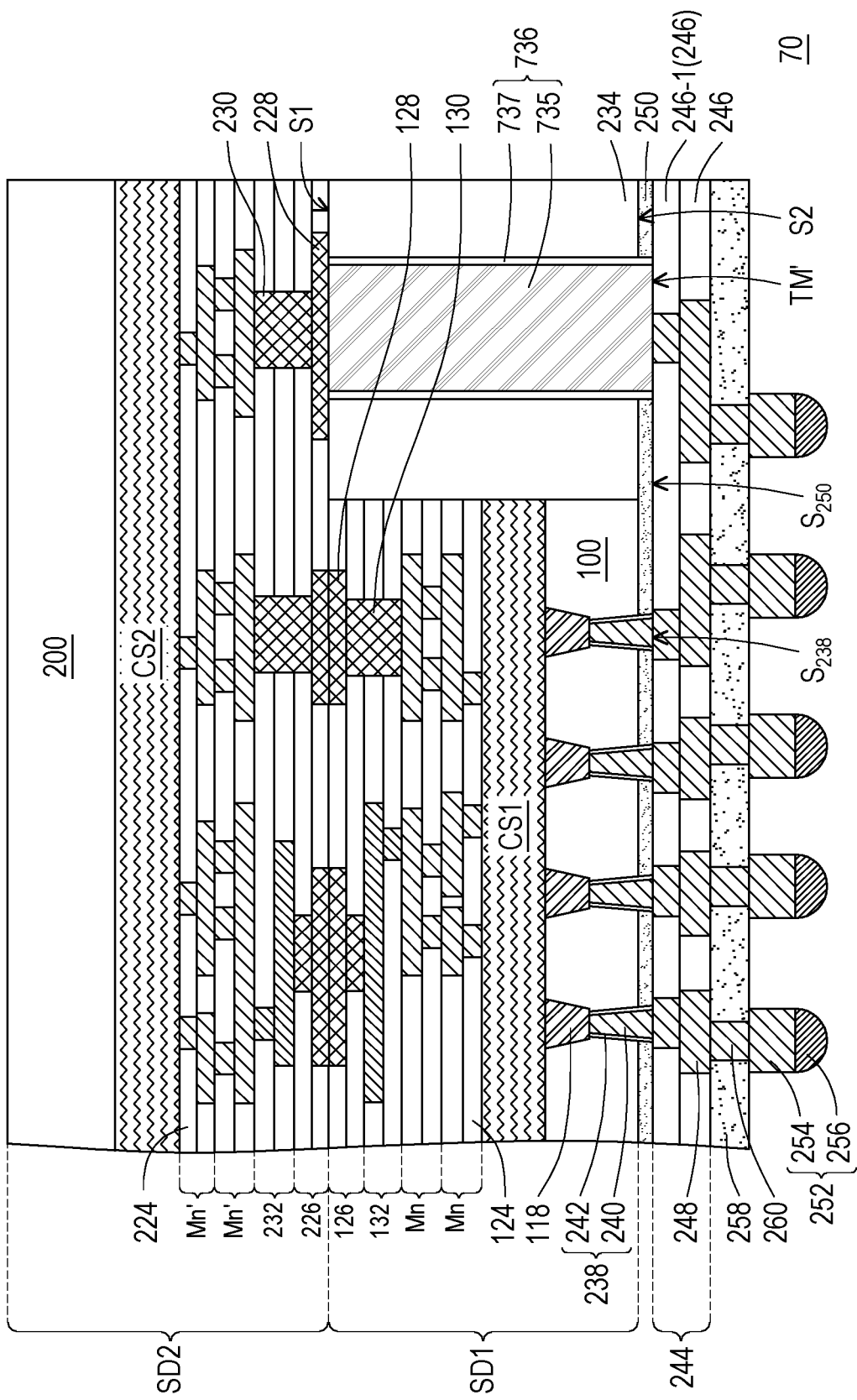
FIG. 7 is a schematic cross-sectional view illustrating a semiconductor package, according to some embodiments of the present disclosure.

FIG. 7 is a schematic cross-sectional view illustrating a semiconductor package 70, according to some embodiments of the present disclosure. The semiconductor package 70 is similar to the semiconductor package 20 as described with reference to FIG. 2A. Only differences between the semiconductor packages 20, 70 will be described. The same or similar parts of the semiconductor packages 20, 70 may not be repeated again.

Referring to FIG. 7, the dielectric material 234 is penetrated by through dielectric vias 736 (only one of them is shown). In some embodiments, the through dielectric vias 736 further extend through the passivation layer 250. In these embodiments, a terminal surface TM' of each through dielectric via 736 may be substantially coplanar with the surface $S_{250}$ of the passivation layer 250 facing toward the redistribution structure 244, and also substantially coplanar with surfaces $S_{238}$ of the TSVs 238 facing away from the power rails 118. On the other hand, the other terminal of each through dielectric via 736 may be bounded at a bonding pad 228 of the second semiconductor die SD2.

According to some embodiments, each through dielectric via 736 includes a conductive column 735 and a barrier layer 737 wrapping around the conductive column 735 and separating the conductive column 735 from the surrounding dielectric material 234 and passivation layer 250. In certain cases, the barrier layer 737 further extends between the conductive column 735 and the second semiconductor die SD2. As examples, the conductive column 735 may be formed of copper, while the barrier layer 737 may be formed of a titanium-based material or a tantalum-based material.

Further, in some embodiments, the through dielectric vias 736 are active through dielectric vias, and are configured to rout the bonding pads 228 at the peripheral portion of the second semiconductor die SD2 to a back side of the first semiconductor die SD1. In these embodiments, the bonding pads 228 routed by the through dielectric vias 736 may be connected to the conductive features in the metallization layers Mn'. Further, the through dielectric vias 736 may be routed to some electrical connectors 252 through redistribution elements 248 spreading in between.

Figure 8:
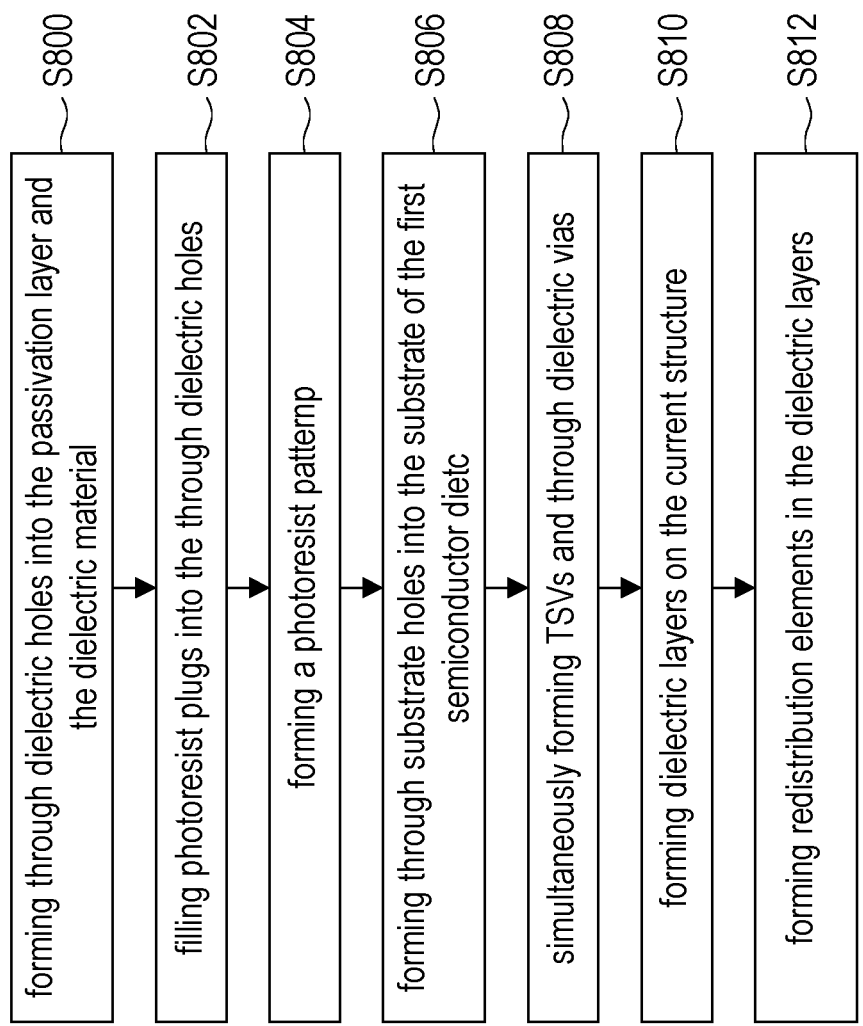
FIG. 8 is a flow diagram illustrating a part of a manufacturing process for forming the semiconductor package as shown in FIG. 7.

FIG. 8 is a flow diagram illustrating a part of a manufacturing process for forming the semiconductor package 70 as shown in FIG. 7. FIG. 9A through FIG. 9G are schematic cross-sectional views illustrating structures at various stages during the manufacturing process shown in FIG. 8.

The manufacturing process may include performing the steps S500, step S502, step S504, S506, S508 and step S510 as described with reference to FIG. 6A through FIG. 6F, and a package structure with the dielectric material 234 surrounding the first semiconductor die SD1 and the passivation layer 250 covering on top is obtained. The obtained structure is further processes.

Figure 9A:
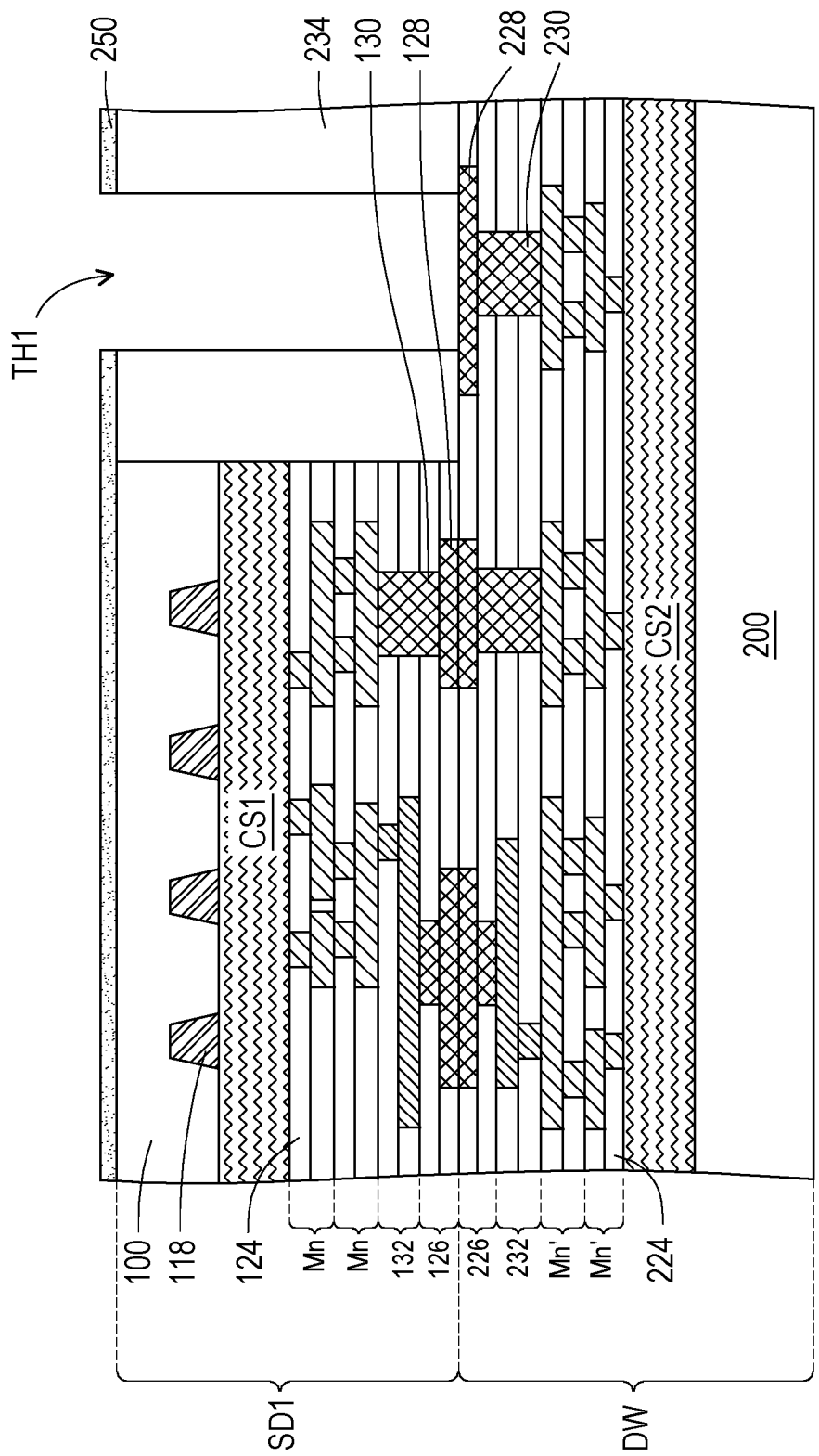
FIG. 9A through FIG. 9G are schematic cross-sectional views illustrating structures at various stages during the manufacturing process shown in FIG. 8.

Referring to FIG. 8 and FIG. 9A, step S800 is performed, and through dielectric holes TH1 (only one of them is shown) are formed through the passivation layer 250 and the dielectric material 234. The through dielectric holes TH1 will accommodate the through dielectric vias 736 to be formed in a subsequent process step. A method for forming the through dielectric holes TH1 may include a lithography process and at least one etching process.

Figure 9B:
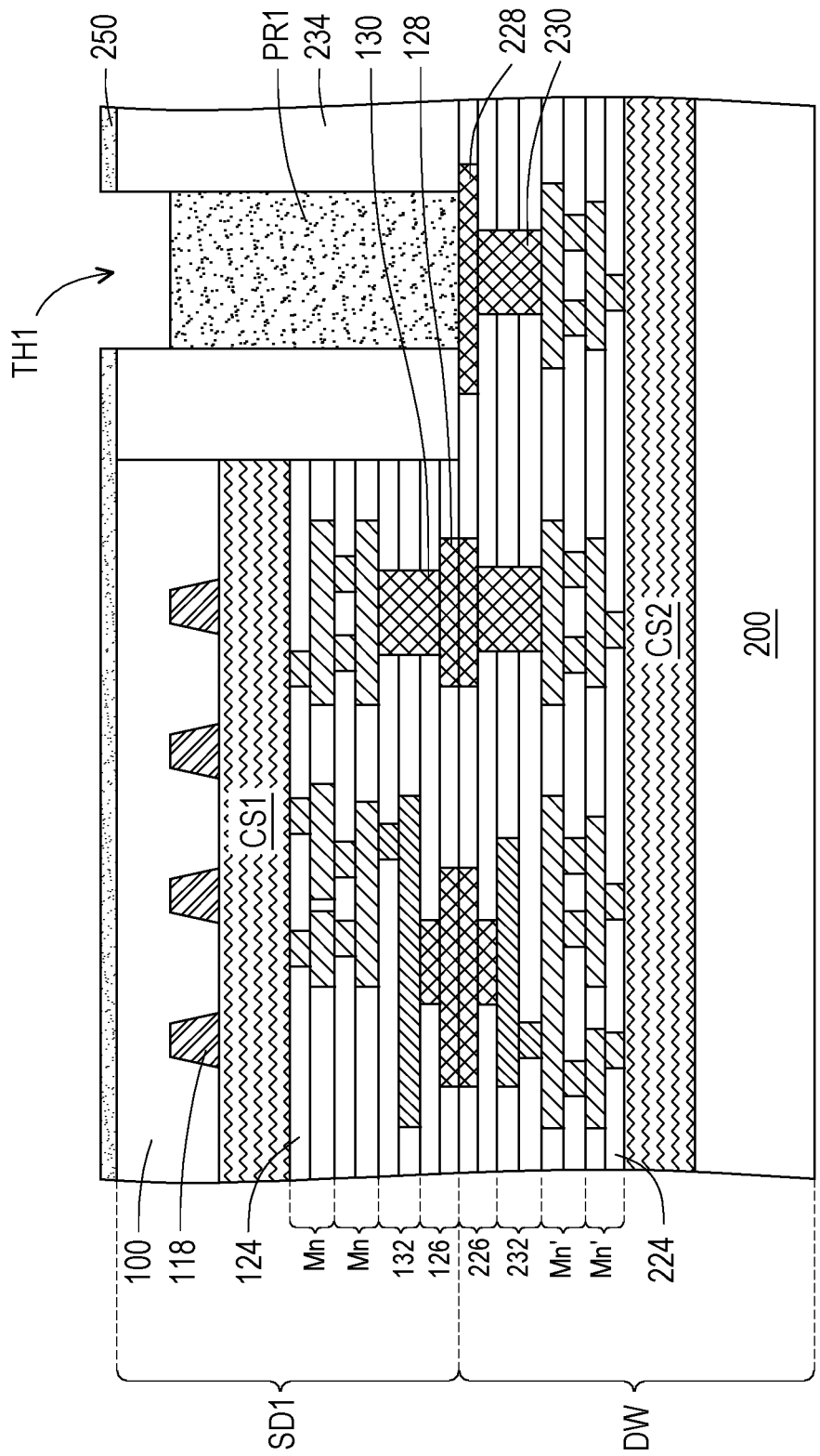

Referring to FIG. 8 and FIG. 9B, step S802 is performed, and photoresist plugs PR1 are filled in the through dielectric holes TH1. According to some embodiments, the photoresist plugs PR1 are filled to a height lower than a top surface of the dielectric material 234. A method for forming the photoresist plugs PR1 may include forming a photoresist layer filling up the through dielectric holes TH1 and covering the passivation layer 250 by a coating process. Subsequently, portions of the photoresist layer above the passivation layer 250 are removed, and portions of the photoresist layer in the through dielectric holes TH1 are further recessed to form the photoresist plugs PR1 by a stripping process.

Figure 9C:
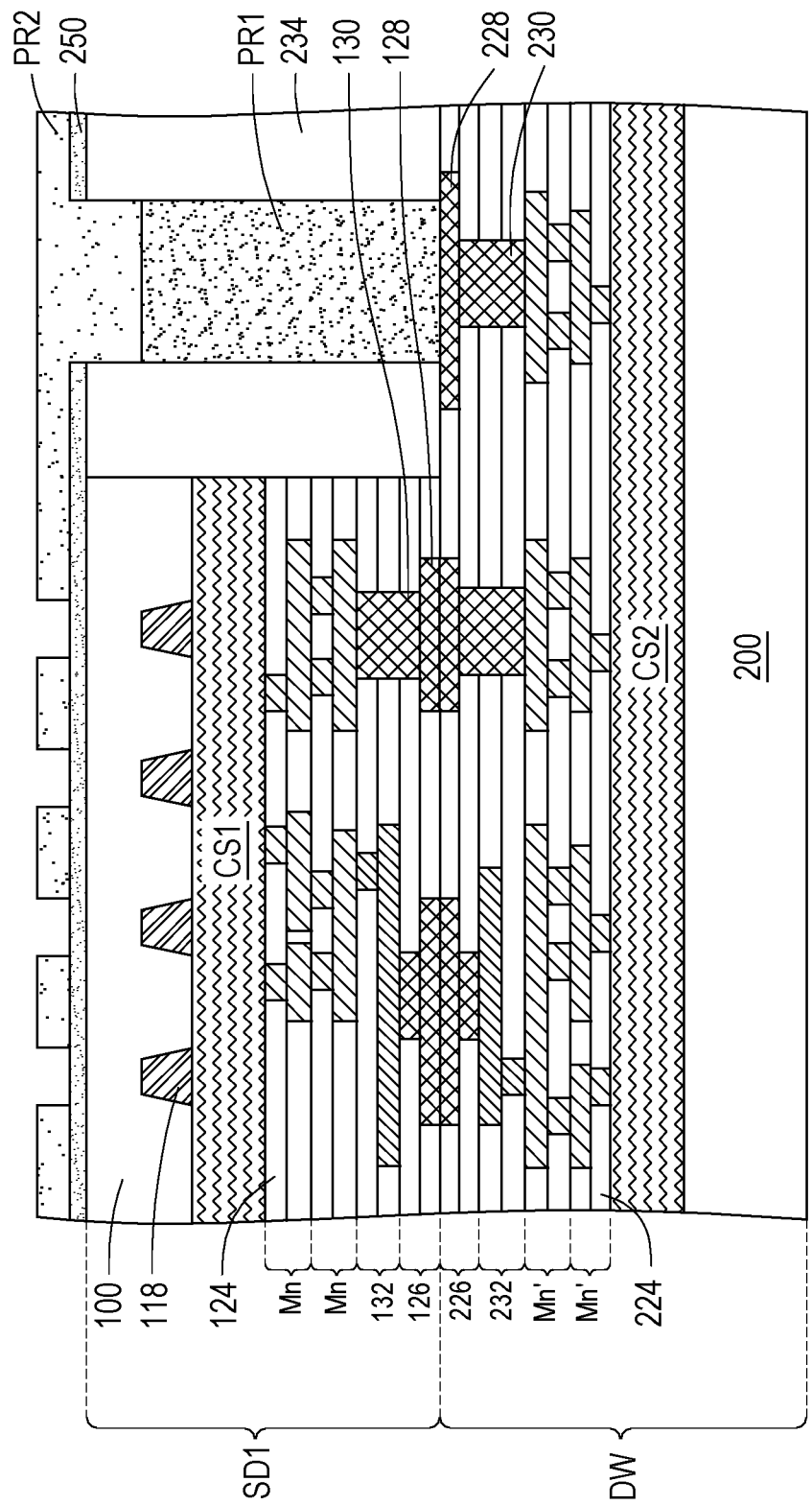

Referring to FIG. 8 and FIG. 9C, step S804 is performed, and a photoresist pattern PR2 is formed. The photoresist pattern PR2 is formed on the passivation layer 250, and extend into the through dielectric holes TH1 to top surfaces of the photoresist plugs PR1. Further, the photoresist pattern PR2 has openings for defining locations of the through substrate holes TH2 to be formed in the following process step. A method for forming the photoresist pattern PR2 may include a lithography process.

Figure 9D:
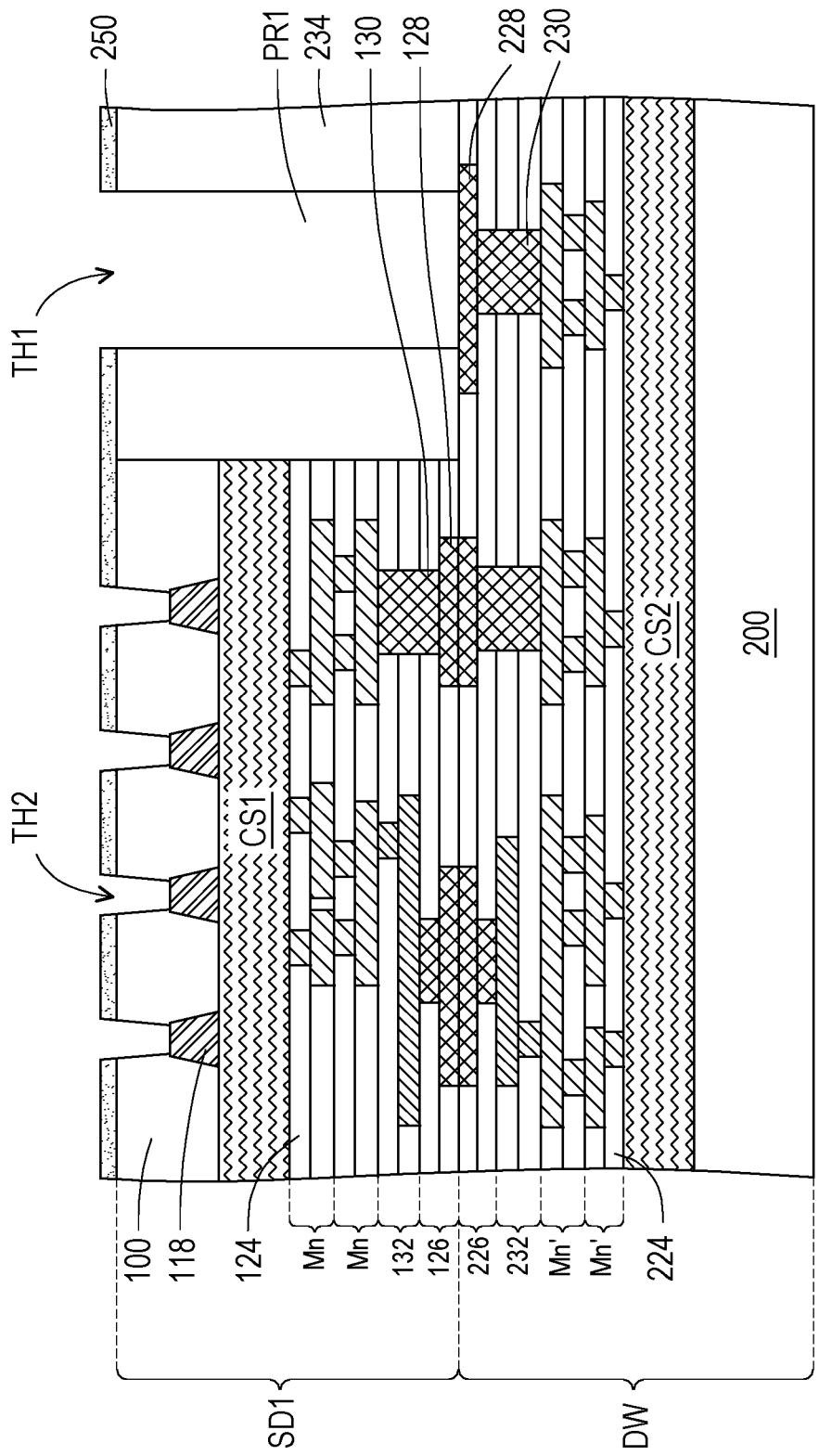

Referring to FIG. 8 and FIG. 9D, step S806 is performed, and through substrate holes TH2 are formed into the substrate 100. The through substrate holes TH2 penetrate through the passivation layer 250 and extend into the substrate 100 to reach the power rails 118. The through substrate holes TH2 are configured to accommodate the TSVs 238 to be formed in the following process step. A method for forming the through substrate holes TH2 may include an etching process by using the photoresist pattern PR2 as a shadow mask. After formation of the through substrate holes TH2, the photoresist pattern PR2 and the photoresist plugs PR1 are removed.

Figure 9E:
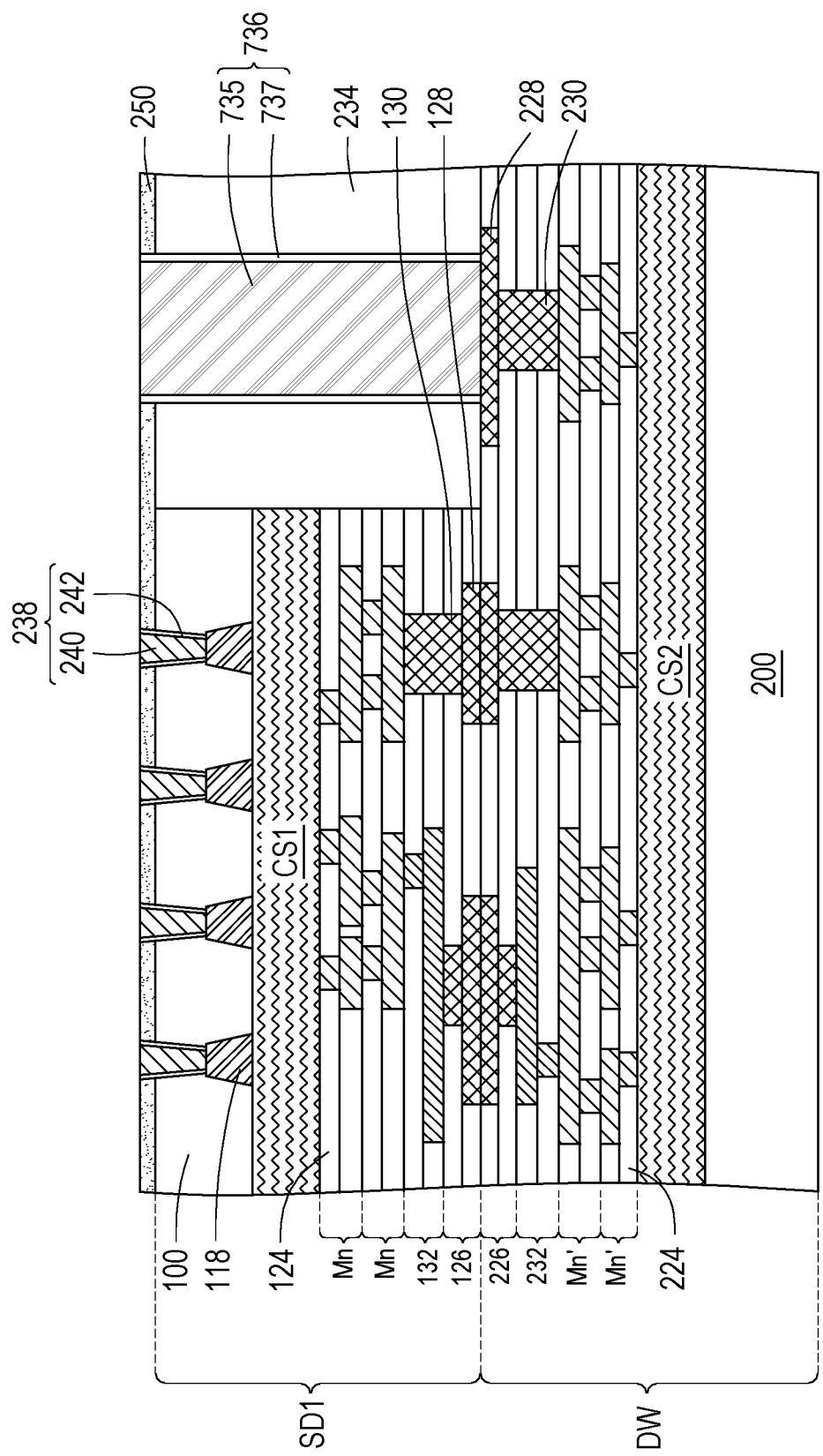

Referring to FIG. 8 and FIG. 9E, step S808 is performed, and the TSVs 238 as well as the through dielectric vias 736 are simultaneously formed. In some embodiments, a method for forming the TSVs 238 and the through dielectric vias 736 includes forming an initial barrier layer conformally covering entire exposed surfaces of the recessed structure as shown in FIG. 9D by a deposition process (e.g., a CVD process). Subsequently, portions of the initial barrier layer lining along bottom surfaces of the recesses defined by the through dielectric holes TH1 and the through substrate holes TH2 are removed by an etching process. During the etching process, portions of the initial barrier layer extending along a top surface of the passivation layer 250 may also be removed. Portions of the initial barrier layer remained in the through dielectric holes TH1 form the barrier layers 737, while portions of the initial barrier layer remained in the through substrate holes TH2 form the barrier layers 242. Thereafter, a conductive material is provided by a deposition process (a PVD process or a CVD process), a plating process or a combination thereof, to fill up the through dielectric holes TH1 and the through substrate holes TH2, and to cover the passivation layer 250. Afterwards, portions of the conductive material above the passivation layer 250 may be removed by a planarization process. Portions of the conductive material remained in the through dielectric holes TH1 form the conductive columns 735, while portions of the conductive material remained in the through substrate holes TH2 form the through vias 240.

Figure 9F:
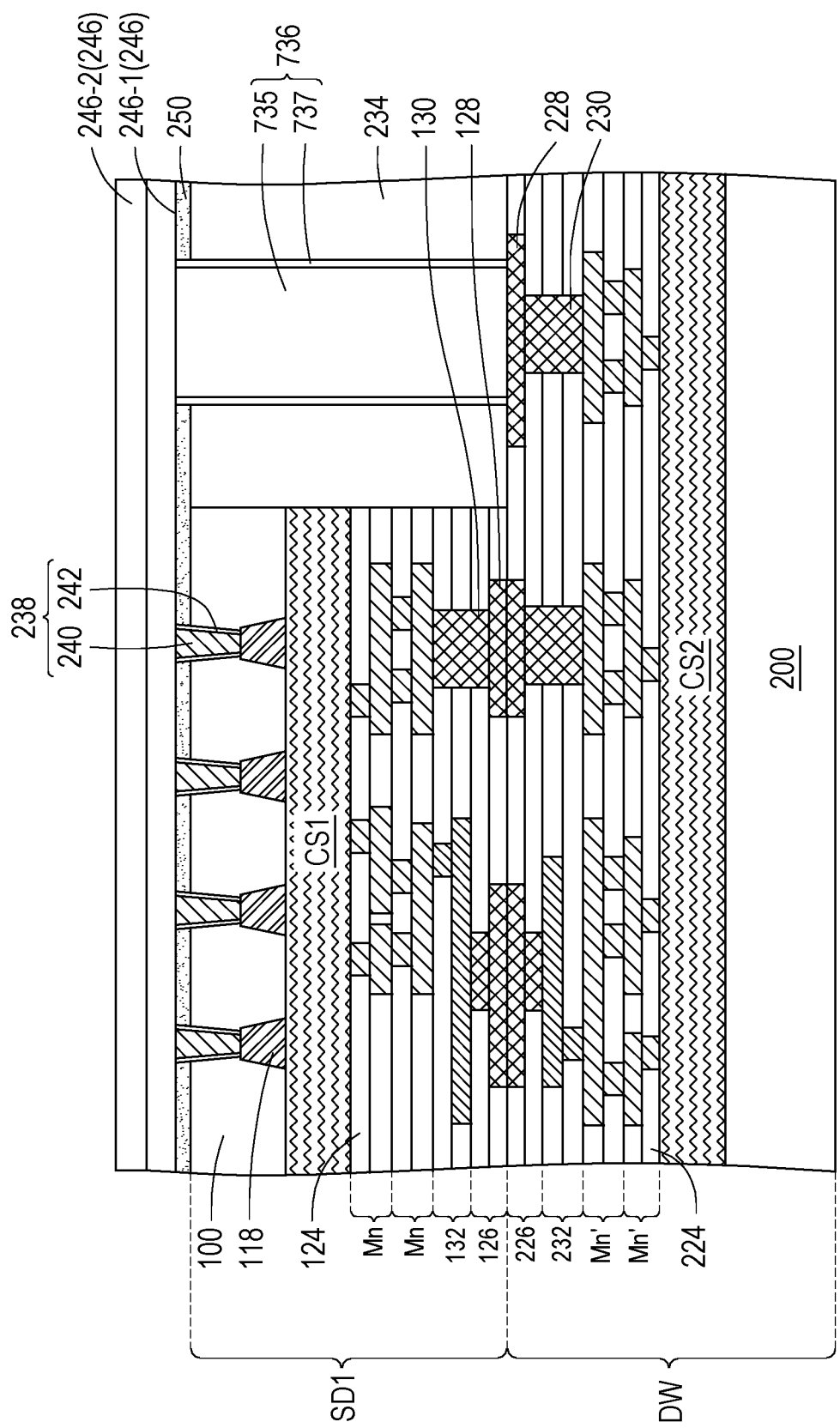

Referring to FIG. 8 and FIG. 9F, step S810 is performed, and the dielectric layers 246-1, 246-2 are formed on the current structure. The passivation layer 250, the TSVs 238 and the through dielectric vias 736 are covered by the dielectric layers 246-1, 246-2. In some embodiments, the dielectric layers 246-1, 246-2 are respectively formed by a deposition process, such as a CVD process.

Figure 9G:
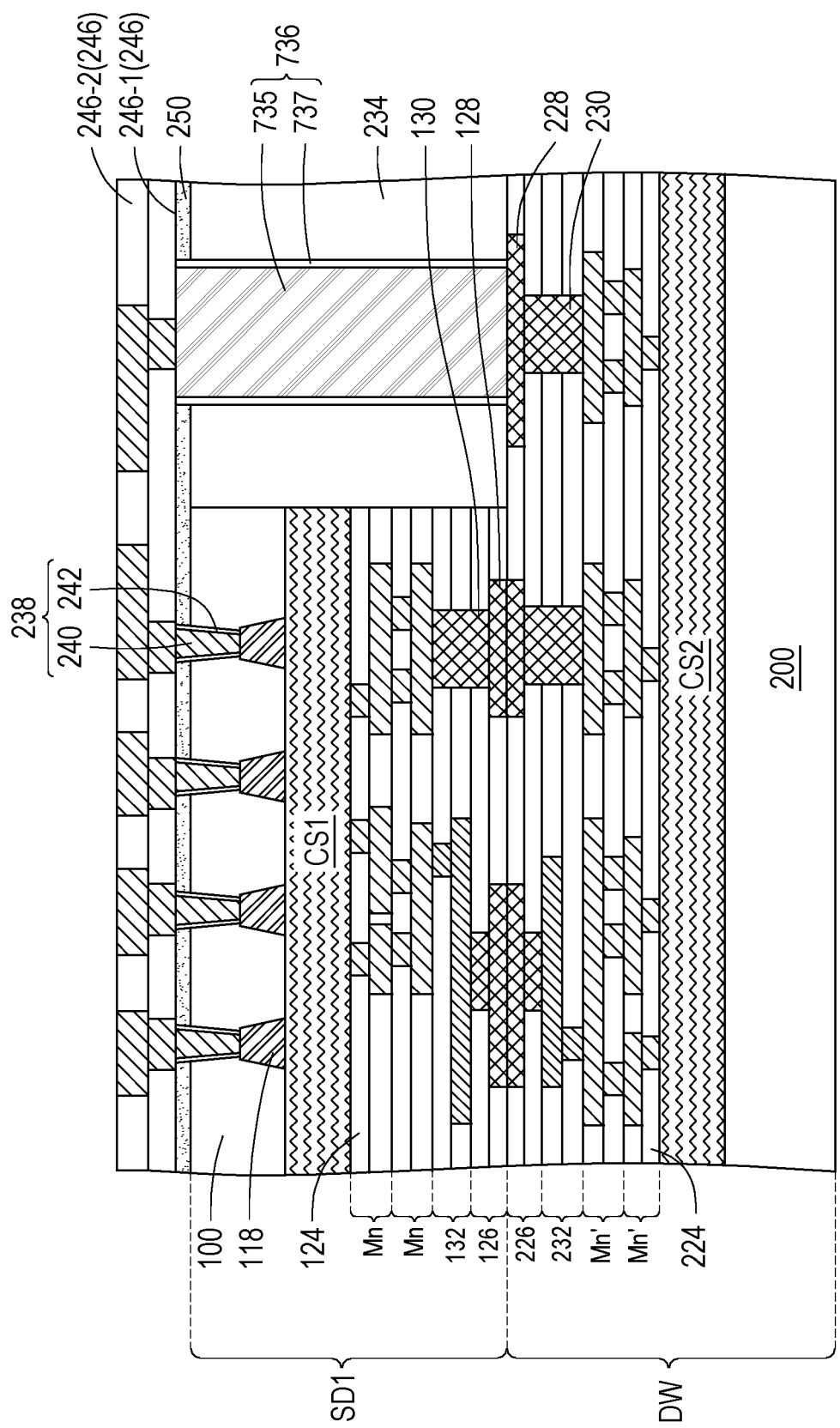

Referring to FIG. 8 and FIG. 9G, step S812 is performed, and the redistribution elements 248 are formed in the stack of dielectric layers 246-1, 246-2. As similar to the step S520 described with reference to FIG. 6K, the redistribution elements 248 may also be formed by a damascene process in the current step. In those embodiments where the redistribution structure 244 includes more dielectric layers 246 and redistribution elements 248, the deposition of dielectric layer and the damascene process may be repeated till the entire redistribution structure 244 is formed.

Further, the current structure may be further processed to form the semiconductor package 70 as described with reference to FIG. 7. The further processes may include (but not limited to) forming the electrical connectors 252, the passivation layer 260 and the through conductive vias 258 on the redistribution structure 244, and a possible singulation. As a result of such singulation process, the redistribution structure 244 and the dielectric material 234 are cut along boundary of the die region in the device wafer DW, and the die region in the device wafer DW is singulated to form the second semiconductor die SD2. Accordingly, a sidewall of the redistribution structure 244 and an outer sidewall of the dielectric material 234 can be substantially coplanar with a sidewall of the second semiconductor die SD2.

Figure 10:
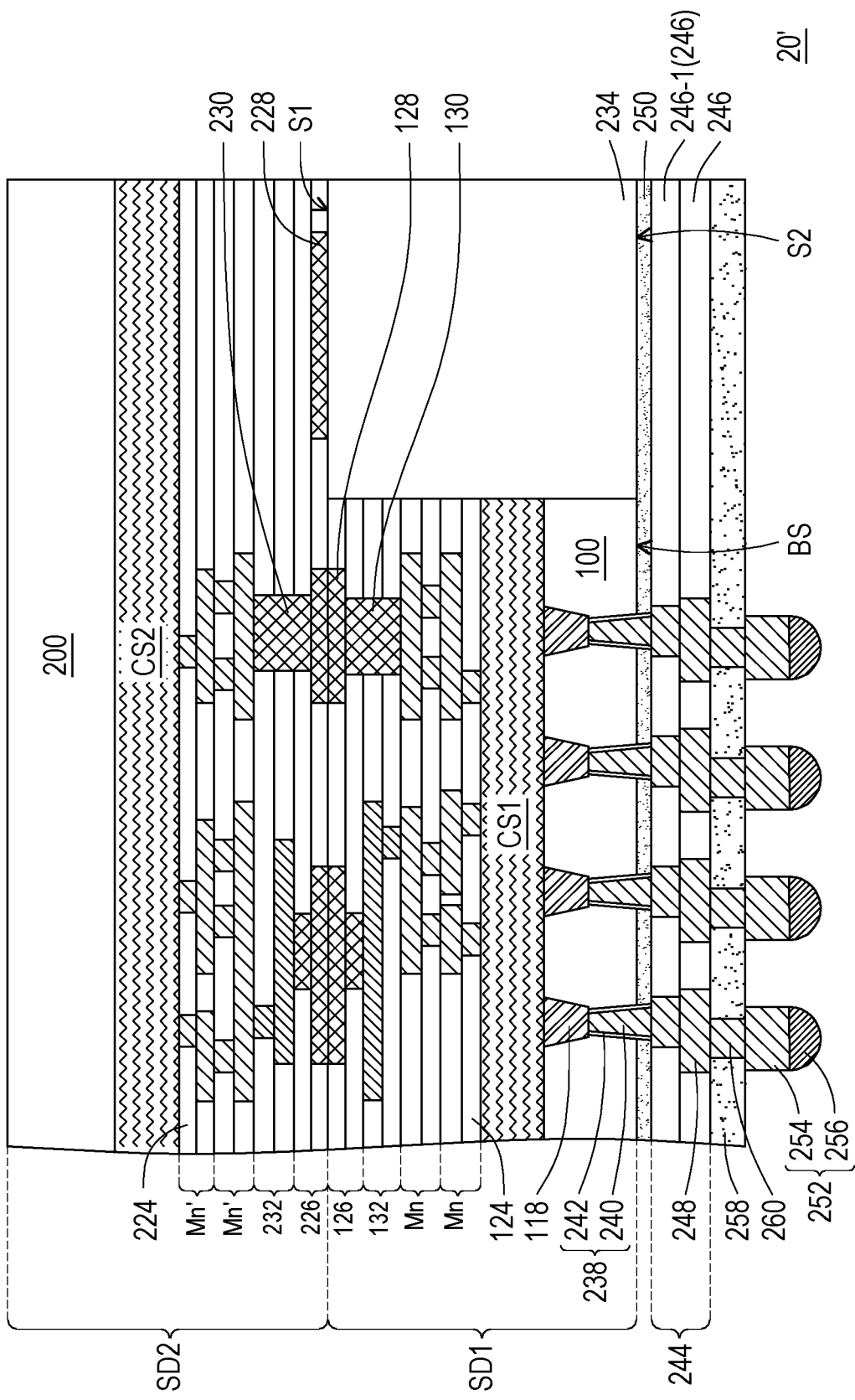
FIG. 10 is a schematic cross-sectional view illustrating a semiconductor package, according to some embodiments of the present disclosure.

FIG. 10 is a schematic cross-sectional view illustrating a semiconductor package 20', according to some embodiments of the present disclosure.

Referring to FIG. 10, the semiconductor package 20' is similar to the semiconductor package 20 as described with reference to FIG. 2A, except that the semiconductor package 20' does not have any through dielectric via. As shown in FIG. 10, the dielectric material 234 completely fills a space laterally surrounding the first semiconductor die SD1 and in contact with a peripheral portion of the second semiconductor die SD2. In regarding manufacturing of the semiconductor package 20', the process step(s) for forming a through dielectric via can be omitted.

As above, by deploying PDN spreading at a back side of a semiconductor die and extending to a front side of the semiconductor die through a substrate, power and ground signals can be provided to front-side transistors of the semiconductor die via shorter paths. Further, since the PDN no longer occupy routing area at the front side of the semiconductor die, the routing area can be reduced. Accordingly, a size of each cell in an integrated circuit formed in the semiconductor die, which is determined by routing area of each cell, can be further scaled. Furthermore, during packaging of the semiconductor die, an eventual thickness of the substrate can be dependent on a thickness of a dielectric layer to be patterned to form a dielectric material laterally surrounding the semiconductor die, thus thinning of the substrate can be well controlled without limited to using a certain type of substrate with an etching stop layer sandwiched between bulk semiconductor and a semiconductor layer. Accordingly, the semiconductor die can be packaged by a rather cost-effective process.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an aspect of the present disclosure, a semiconductor package is provided. The semiconductor package comprises a semiconductor die; a dielectric material; through substrate vias and a redistribution structure. The semiconductor die comprises: a substrate; transistors, formed at a front side of the substrate; metallization layers, covering the transistors; and power rails, extending into the substrate form the front side of the substrate, and electrically connected to the transistors through conductive features in the metallization layers. The dielectric material laterally surrounds the semiconductor die, and has a surface substantially coplanar with a back surface of the substrate. The through substrate vias extend into the substrate from a back side of the substrate, and are electrically connected with the power rails. The redistribution structure covers the back surface of the substrate and the surface of the dielectric material, and has redistribution elements electrically connected to the through substrate vias.

In another aspect of the present disclosure, a semiconductor package is provided. The semiconductor package comprises: a first semiconductor die, comprising: a substrate; transistors, formed at a front side of the substrate; metallization layers, covering the transistors; and power rails, extending into the substrate form the front side of the substrate, and electrically connected to the transistors through conductive features in the metallization layers. The semiconductor package further comprises: a second semiconductor die, having a central portion bonded with the first semiconductor die; a dielectric material, laterally surrounding the semiconductor die and in contact with a peripheral portion of the second semiconductor die, wherein a surface of the dielectric material is substantially coplanar with a back surface of the substrate; through substrate vias, extending into the substrate from a back side of the substrate, and electrically connected with the power rails; and a redistribution structure, covering the back surface of the substrate and the surface of the dielectric material, and having redistribution elements electrically connected to the through substrate vias.

In yet another aspect of the present disclosure, a semiconductor package is provided. The semiconductor package comprises: a first semiconductor die, comprising a substrate and transistors formed at a front side of the substrate; a power distribution network, spreading at a back side of the substrate and penetrating through the substrate, to provide power and ground signals to the transistors; a dielectric material, laterally surrounding the first semiconductor die; and a second semiconductor die, having a central portion bonded with the first semiconductor die and a peripheral portion in contact with the dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a semiconductor die, comprising:
  a substrate;
  transistors, disposed at a front side of the substrate;
  metallization layers, disposed above the transistors; and
  power rails, disposed in the substrate and adjacent to the front side of the substrate, and electrically connected to the transistors through conductive features in the metallization layers;
a dielectric material, in lateral contact with the semiconductor die, and having a surface substantially coplanar with a back surface of the substrate;
through substrate vias, disposed in the substrate and adjacent to a back side of the substrate, and electrically connected with the power rails; and a redistribution structure, covering the back surface of the substrate and the surface of the dielectric material, and having redistribution elements electrically connected to the through substrate vias.

2. The semiconductor package according to claim 1, wherein the dielectric material has another surface substantially coplanar with a front surface of the semiconductor die.

3. The semiconductor package according to claim 1, wherein the dielectric material is as thick as the semiconductor die.

4. The semiconductor package according to claim 1, wherein the dielectric material comprises an inorganic dielectric material.

5. The semiconductor package according to claim 1, further comprising a through dielectric via extending through the dielectric material.

6. The semiconductor package according to claim 5, wherein the through dielectric via is protruded with respect to the back surface of the substrate.

7. The semiconductor package according to claim 5, wherein a vertical dimension of the through dielectric via is greater than a thickness of the semiconductor die.

8. The semiconductor package according to claim 5, wherein a terminal surface of the through dielectric via is substantially coplanar with surfaces of the through substrate vias facing away from the power rails.

9. The semiconductor package according to claim 5, wherein the through dielectric via is protruded with respect to surfaces of the through substrate vias facing away from the power rails.

10. The semiconductor package according to claim 9, wherein the through dielectric via extends into the redistribution structure.

11. The semiconductor package according to claim 10, wherein the redistribution structure comprises a stack of dielectric layers, the redistribution elements spread in the stack of dielectric layers, the through dielectric via penetrates through a first dielectric layer of the dielectric layers closest to the dielectric material, and terminates at an interface between the first dielectric layer and a second dielectric layer of the dielectric layers.

12. The semiconductor package according to claim 1, further comprising a passivation layer separating the substrate from the redistribution structure, and extending between the dielectric material and the redistribution structure.

13. The semiconductor package according to claim 12, wherein the through substrate vias extend to the redistribution structure through the passivation layer.

14. The semiconductor package according to claim 12, further comprising a through dielectric via extending through the dielectric material, wherein a terminal surface of the through dielectric via is substantially coplanar with a surface of the passivation layer facing toward the redistribution structure.

15. The semiconductor package according to claim 12, further comprising a through dielectric via extending through the dielectric material, wherein the through dielectric via is protruded with respect to a surface of the passivation layer facing toward the redistribution structure.

16. A semiconductor package, comprising:
a first semiconductor die, comprising:
a substrate;
transistors, formed at a front side of the substrate;
metallization layers, covering the transistors; and
power rails, extending into the substrate form the front side of the substrate, and electrically connected to the transistors through conductive features in the metallization layers;
a second semiconductor die, having a central portion bonded with the first semiconductor die;
a dielectric material, laterally surrounding the semiconductor die and in contact with a peripheral portion of the second semiconductor die, wherein a surface of the dielectric material is substantially coplanar with a back surface of the substrate;
through substrate vias, extending into the substrate from a back side of the substrate, and electrically connected with the power rails; and
a redistribution structure, covering the back surface of the substrate and the surface of the dielectric material, and having redistribution elements electrically connected to the through substrate vias.

17. The semiconductor package according to claim 16, wherein a sidewall of the dielectric material is substantially coplanar with a sidewall of the second semiconductor die.

18. The semiconductor package according to claim 16, further comprising a through dielectric via penetrating through the dielectric material and in contact with the second semiconductor die.

* * * * *